(12) United States Patent
Kim et al.

(10) Patent No.: US 8,486,318 B2
(45) Date of Patent: Jul. 16, 2013

(54) FIBER, FIBER AGGREGATE AND ADHESIVE HAVING THE SAME

(75) Inventors: Deok Hoon Kim, Chungcheongbuk-Do (KR); Kyung Wook Paik, Daejeon (KR); Kyoung Lim Suk, Daejeon (KR); Jae Ok Kim, Seoul (KR)

(73) Assignees: Optopac Co., Ltd. (KR); Korea Advanced Institute of Science and Technology (KR); Micropack Co., Ltd. (KR)

( * ) Notice: Subject to any disclaimer, the term of this patent is extended or adjusted under 35 U.S.C. 154(b) by 0 days.

(21) Appl. No.: 13/111,850

(22) Filed: May 19, 2011

(65) Prior Publication Data

US 2012/0228805 A1   Sep. 13, 2012

Related U.S. Application Data

(62) Division of application No. 13/075,147, filed on Mar. 29, 2011.

(30) Foreign Application Priority Data

Mar. 11, 2011   (KR) .................. 10-2011-0022041

(51) Int. Cl.
    *B29C 47/02*   (2006.01)
(52) U.S. Cl.
    USPC ............. 264/205; 264/21; 264/104; 264/105; 264/211; 264/465
(58) Field of Classification Search
    USPC ................... 264/21, 104, 105, 205, 211, 465
    See application file for complete search history.

(56) References Cited

U.S. PATENT DOCUMENTS

| 5,971,253 | A | 10/1999 | Gilleo et al. | |
| 6,171,985 | B1 | 1/2001 | Joseph et al. | |
| 6,667,099 | B1* | 12/2003 | Greiner et al. | 428/398 |
| 6,878,435 | B2* | 4/2005 | Paik et al. | 428/215 |
| 7,452,923 | B2 | 11/2008 | Jeon et al. | |
| 2001/0006715 | A1* | 7/2001 | Pinter et al. | 428/90 |
| 2003/0098518 | A1* | 5/2003 | Averdung et al. | 264/10 |
| 2007/0112115 | A1* | 5/2007 | Shalaby et al. | 524/431 |
| 2007/0138459 | A1* | 6/2007 | Wong et al. | 257/9 |
| 2007/0298259 | A1* | 12/2007 | Matsumoto | 428/407 |

(Continued)

FOREIGN PATENT DOCUMENTS

| JP | 5209157 A | 8/1993 |
| JP | 6049422 A | 2/1994 |

(Continued)

OTHER PUBLICATIONS

US Office Action dated Feb. 14, 2012 in related U.S. Appl. No. 13/111,824 (22 pages).

(Continued)

*Primary Examiner* — Christina Johnson
*Assistant Examiner* — Saeed Huda

(57) ABSTRACT

Provided is a functional fiber and a fiber aggregate for realizing various functions, an adhesive for easily bonding electronic components, and a method for manufacturing the same. Particularly, a fiber extended in a length direction includes a carrier polymer and a plurality of functional particles, wherein the plurality of functional particles are embedded in the carrier polymer and physically fixed to the carrier polymer to be integrated.

19 Claims, 14 Drawing Sheets

U.S. PATENT DOCUMENTS

| | | | |
|---|---|---|---|
| 2008/0275327 A1* | 11/2008 | Faarbaek et al. | 600/382 |
| 2009/0004086 A1* | 1/2009 | Kuhling et al. | 423/276 |
| 2009/0061190 A1* | 3/2009 | Gazit et al. | 428/220 |
| 2010/0096183 A1* | 4/2010 | Rice | 174/70 C |
| 2012/0231260 A1* | 9/2012 | Kim et al. | 428/327 |
| 2012/0231689 A1* | 9/2012 | Kim et al. | 442/181 |

FOREIGN PATENT DOCUMENTS

| | | |
|---|---|---|
| JP | 6-333965 | 12/1994 |
| JP | 7-230840 | 8/1995 |
| JP | 11060890 A | 3/1999 |
| JP | 2001-11404 | 1/2001 |
| JP | 2001096499 A | 4/2001 |
| JP | 2006-35092 | 2/2006 |
| JP | 2008055710 A | 3/2008 |
| JP | 2008-240172 | 10/2008 |
| JP | 2009-34677 | 2/2009 |
| JP | 2010-236138 | 10/2010 |
| KR | 20060041196 A | 5/2006 |
| KR | 10-0740730 | 7/2007 |
| KR | 20070092639 A | 9/2007 |
| KR | 20080098841 A | 11/2008 |
| KR | 10-2011-0015319 | 2/2011 |
| KR | 20110035067 A | 4/2011 |
| KR | 20110081484 A | 7/2011 |
| WO | 2008-004448 | 1/2008 |
| WO | 2009-096365 | 8/2009 |

OTHER PUBLICATIONS

US Office Action dated Mar. 14, 2012 in related U.S. Appl. No. 13/075,147 (20 pages).

US Office Action dated Sep. 15, 2011 in related U.S. Appl. No. 13/111,824 (22 pages).

USPTO Non-final OA Action in U.S. Appl. No. 13/075,141 mailed Sep. 15, 2011.

USPTO Non-Final Office Action in U.S. Appl. No. 13/075,147 mailed Nov. 9, 2011.

\* cited by examiner

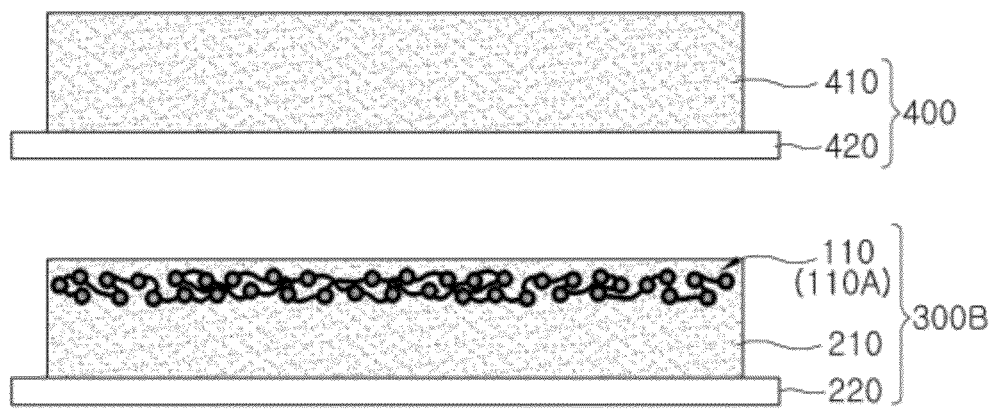

FIBER, FIBER AGGREGATE AND ADHESIVE HAVING THE SAME

CROSS-REFERENCE TO RELATED APPLICATION

This application is a Divisional Application of U.S. application Ser. No. 13/075,147, filed Mar. 29, 2011, which claims priority to Korean Patent application No. 110-2011-0022041 filed on Mar. 11, 2011 and all the benefits accruing therefrom under 35 U.S.C. §119, the contents of which are incorporated by reference in their entirety.

BACKGROUND

The present disclosure relates to a fiber, a fiber aggregate, and an adhesive having the same, and more particularly, to a functional fiber and a fiber aggregate for realizing various functions, an adhesive for easily bonding electronic components, and a method for manufacturing the same.

An anisotropic conductive adhesive is a binder for simultaneously performing an electrical connection between electrodes by conductive particles and a mechanical connection by a thermosetting property of thermosetting resins based on thermosetting resins and conductive particles dispersed in the thermosetting resins.

A method of connecting electronic components using an anisotropic conductive adhesive is a lead free process which replaces a conventional soldering process. According to the method, a process is simple, environmentally friendly, and more thermally stable because it is unnecessary to momentarily apply high heat to products (low temperature process). In addition, manufacturing cost can be reduced because of using an inexpensive substrate such as a glass substrate or polyester flex, and it is possible to realize an ultrafine electrode pitch because electronic components are electrically connected by using fine conductive particles.

An anisotropic conductive adhesive having the abovementioned merits is widely used for display packaging such as a smart card, a Liquid Crystal Display (LCD), a Plasma Display Panel (PDP) and a computer, a cell phone, a communication system, and the like.

One of the application fields where an anisotropic conductive adhesive is most commonly used is display module mounting. A market of an anisotropic conductive adhesive for an Outer Lead Bonding (OLB) used for connecting a flexible substrate to a glass substrate, and an anisotropic conductive adhesive for Printed Circuit Board (PCB) used for bonding a flexible substrate to a PCB is one of the fastest-growing markets.

Furthermore, the necessity of ultrafine pitch connection in Chip On Glass (COG) bonding of directly connecting a driver IC chip to a glass substrate and Chip On Film (COF) bonding of directly flip-chip connecting a driver IC chip to a flexible substrate becomes more important as a driver IC becomes highly integrated and complicated. Therefore, the importance of anisotropic conductive adhesive is also rapidly growing.

According to a technology of mounting electronic components using an anisotropic conductive adhesive, a thermo-compression bonding process is basically used for completing connection by virtue of conduction due to conductive particles between electrode pads, and thermosetting of surrounding thermosetting resins.

During the thermocompression bonding process, conductive particles are moved due to flow of thermosetting resins included in an anisotropic conductive film. Therefore, a large amount of conductive particles should be used for preventing an electrical disconnection (hereinafter, referred as 'open' for simplicity), and conductive particles having a core-shell structure, where conductive particles are embedded by non-conductive materials, or a mixture of conductive particles and nonconductive particles should be used for preventing an electrical short (hereinafter, referred to as 'short' for simplicity).

As the necessity of ultrafine pitch connection is increased, the importance of technology for applying an electrical stability in vertical direction and electrical selectivity in X-Y direction without undesired electric current between electrodes is increased →.

FIG. 1 illustrates a related art method of connecting two electronic components using a related art anisotropic conductive film. In detail, as illustrated in FIG. 1A, according to a related art method for connecting two electronic components 10 and 30, after an anisotropic conductive film 20 containing a thermosetting polymer resin 22 and conductive metal particles 21 is attached on a surface of the electronic component 10 where an electrode 11 is formed, the electrode 11 is aligned with an electrode 31 of another electronic component 30. Then, heat and pressure are applied (thermally compressed) to thereby harden the thermosetting polymer resin 22 and electrically connect the two electrodes 11 and 31 to each other through the conductive particles 21.

However, according to such a related art method, as illustrated in FIG. 1B, the conductive particles 21 are ousted from an upper portion of the electrode 11 or 31 to the outside of the electrode 11 or 31 because the thermosetting polymer resin in the anisotropic film 20 flows during the thermocompression. This results in an electrical disconnection (region 'A' in FIG. 1B) between the electrodes 11 or 31, or an undesired short (region 'B' in FIG. 1B) between the electrodes.

For preventing an open between electrodes, excessive conductive particles should be used. Due to the excessive use of conductive particles, composite particles composed of a shell of nonconductive material and a core of conductive material should be used, or nonconductive particles should be used with conductive particles. However, even such a method cannot be a basic measure for preventing a short in fine pitch electrodes and for obtaining stable and selective electric connection, and requires high manufacturing cost. Thus, the related art method still has a limitation in connecting fine pitch electronic components using an anisotropic conductive film.

SUMMARY

The present disclosure provides a functional fiber and a fiber aggregate for implementing various electromagnetic or optical functions.

The present disclosure also provides an adhesive for stable bonding between electronic components.

The present disclosure also provides a fiber having excellent mechanical strength for easily bonding ultrafine connection parts, a fiber aggregate, an adhesive including the same, and manufacturing methods thereof.

In accordance with an exemplary embodiment, a fiber extended in a length direction includes: a carrier polymer; and a plurality of functional particles, wherein the plurality of functional particles are embedded in the carrier polymer and physically fixed to the carrier polymer to be integrated.

The carrier polymer may include a coating part configured to coat the functional particle; and an extension part extended in a length direction, and configured to connect a space between the functional particles, wherein the coating part and the extension part are connected to each other.

The carrier polymer may include at least one or a compound of polyolefine, polystyrene, polyvinylalcohol, polyacrylonitrile, polyamide, polyester, aramide, acrylic, polythylene oxide (PEO), polycaprolactone, polycarbonate, polyethylene terephthalate, polybezimidazole (PBI), poly(2-hydroxyethylmethacrylate), polyvinylidene fluoride, poly (ether imide), styrene-butadiene-styrene triblock copolymer (SBS), poly(ferrocenyldimethylsilane), polyphenylenesulfide, and polyetheretherkeone.

The functional particle may include at least one of an electrically conductive particle, a far-infrared radiation particle, a fluorescent particle, a phosphorescent particle, and a magnetic particle.

The electrically conductive particle may include at least one or a compound of Ni, Ag, Cu, Au, Sn—Pb base, Sn—Ag base, Sn—Ag—Cu base, Sn—Bi base, Sn—Zn—Bi base, Sn—In base, Sn—Zn—Al base, and Sn—Bi—Ag base; the far-infrared radiation particle may include mullite containing $SiO_2$ or $Al_2O_3$ as a main component, cordierite, zircon, aluminotitanate-based and spodumene-based materials, $ZeO_2$, $Na_2O$, germanium compound (Ge, $GeI_4$, $GeO_2$), at least one or a compound of CeO, $K_2O$, LiO, $BO_3$, $Na_2O$, CaO and MgO, and a ceramic where one of CuO, $Fe_2O_3$, $MnO_2$, CoO and $TiO_2$ is added to mullite, cordierite, zircon, aluminotitanate and spodumene; the fluorescent particle may include at least one or a compound of ZnO, $Ca_2(PO_4)_2$, $CaF_2$:Sb, $CaWO_4$ and $MgWO_4$, the phosphorescent particle may include at least one or a compound of ZnCl, PtOEP, $Ir(piq)_3$, $Btp_2Ir(acac)$, $Ir(PPY)_3$, $Ir(PPy2)(acac)$, $Ir(mpyp)_3$, $F_2Irpic$, $(f2ppu)_2Ir(tmd)$ and $Ir(dfppz)_3$; and the magnetic particle may include at least one or a compound of Ni, Co, $Fe_3O_4$, Pt, Pd, ferrite, soft ferrite, Mn—Zn ferrite, alnico ferrite, Nd—Fe—B and Samarium-Cobalt.

A diameter of the electrically conductive particle may be approximately 0.1 μm to approximately 50 μm.

A thickness of the coating part forming the fiber may be approximately 0.1% to approximately 50% of a radius of the functional particle.

A diameter of the extension part forming the fiber may be approximately 10 nm to 100 μm.

A weight ratio between the carrier polymer and the functional particle may be approximately 1:0.25~25.

The functional particle may include a polymer core; and a functional film coated on an outer surface of the polymer core.

The functional film coated on the polymer core may include at least one of an electric conductive film, a far-infrared radiation film, a fluorescent film, a phosphorescent film, and a magnetic film; the electric conductive film may include at least one or a compound of Ni, Ag, Cu, Au, Sn—Pb base, Sn—Ag base, Sn—Ag—Cu base, Sn—Bi base, Sn—Zn—Bi base, Sn—In base, Sn—Zn—Al base, and Sn—Bi—Ag base; the far-infrared radiation film may include mullite containing $SiO_2$ or $Al_2O_3$ as a main component, cordierite, zircon, aluminotitanate-based and spodumene-based materials, $ZeO_2$, $Na_2O$, germanium compound (Ge, $GeI_4$, $GeO_2$), at least one or a compound of CeO, $K_2O$, LiO, $BO_3$, $Na_2O$, CaO and MgO, and a ceramic where one of CuO, $Fe_2O_3$, $MnO_2$, CoO and $TiO_2$ is added to mullite, cordierite, zircon, aluminotitanate and spodumene; the fluorescent film may include at least one or a compound of ZnO, $Ca_2(PO_4)_2$, $CaF_2$:Sb, $CaWO_4$ and $MgWO_4$; the phosphorescent film may include at least one or a compound of ZnCl, PtOEP, $Ir(piq)_3$, $Btp_2Ir(acac)$, $Ir(PPY)_3$, $Ir(PPy2)(acac)$, $Ir(mpyp)_3$, $F_2Irpic$, $(f2ppu)_2Ir(tmd)$ and $Ir(dfppz)_3$; and the magnetic film may include at least one or a compound of Ni, Co, $Fe_3O_4$, Pt, Pd, ferrite, soft ferrite, Mn—Zn ferrite, alnico ferrite, Nd—Fe—B and Samarium-Cobalt.

A diameter of the functional particle including the polymer core and the electric conductive film coated on the outer surface of the polymer core may be approximately 0.1 μm to approximately 50 μm.

In accordance with another exemplary embodiment, a fiber aggregate includes: a plurality of fibers including a carrier polymer and a functional particle, wherein the functional particle is embedded in the carrier polymer to be physically fixed to the carrier polymer, wherein the plurality of fibers are tangled to form the fiber aggregate.

The plurality of fibers may be regularly arranged or irregularly arranged.

The plurality of fibers may be arranged in a fabric structure of wefts and warp threads.

The functional particle may include at least one of an electrically conductive particle, a far-infrared radiation particle, a fluorescent particle, a phosphorescent particle, and a magnetic particle.

The electrically conductive particle may include at least one or a compound of Ni, Ag, Cu, Au, Sn—Pb base, Sn—Ag base, Sn—Ag—Cu base, Sn—Bi base, Sn—Zn—Bi base, Sn—In base, Sn—Zn—Al base, and Sn—Bi—Ag base; the far-infrared radiation particle may include mullite containing $SiO_2$ or $Al_2O_3$ as a main component, cordierite, zircon, aluminotitanate-based and spodumene-based materials, $ZeO_2$, $Na_2O$, germanium compound (Ge, $GeI_4$, $GeO_2$), at least one or a compound of CeO, $K_2O$, LiO, $BO_3$, $Na_2O$, CaO and MgO, and a ceramic where one of CuO, $Fe_2O_3$, $MnO_2$, CoO and $TiO_2$ is added to mullite, cordierite, zircon, aluminotitanate and spodumene; the fluorescent particle may include at least one or a compound of ZnO, $Ca_2(PO_4)_2$, $CaF_2$:Sb, $CaWO_4$ and $MgWO_4$; the phosphorescent particle may include at least one or a compound of ZnCl, PtOEP, $Ir(piq)_3$, $Btp_2Ir(acac)$, $Ir(PPY)_3$, $Ir(PPy2)(acac)$, $Ir(mpyp)_3$, $F_2Irpic$, $(f2ppu)_2Ir(tmd)$ and $Ir(dfppz)_3$; and the magnetic particle may include at least one or a compound of Ni, Co, $Fe_3O_4$, Pt, Pd, ferrite, soft ferrite, Mn—Zn ferrite, alnico ferrite, Nd—Fe—B and Samarium-Cobalt.

The functional particle may include a polymer core; and a functional film coated on an outer surface of the polymer core.

The functional film coated on the polymer core may include at least one of an electric conductive film, a far-infrared radiation film, a fluorescent film, a phosphorescent film, and a magnetic film; the electric conductive film may include at least one or a compound of Ni, Ag, Cu, Au, Sn—Pb base, Sn—Ag base, Sn—Ag—Cu base, Sn—Bi base, Sn—Zn—Bi base, Sn—In base, Sn—Zn—Al base, and Sn—Bi—Ag base; the far-infrared radiation film may include mullite containing $SiO_2$ or $Al_2O_3$ as a main component, cordierite, zircon, aluminotitanate-based and spodumene-based materials, $ZeO_2$, $Na_2O$, germanium compound (Ge, $GeI_4$, $GeO_2$), at least one or a compound of CeO, $K_2O$, LiO, $BO_3$, $Na_2O$, CaO and MgO, and a ceramic where one of CuO, $Fe_2O_3$, $MnO_2$, CoO and $TiO_2$ is added to mullite, cordierite, zircon, aluminotitanate and spodumene; the fluorescent film may include at least one or a compound of ZnO, $Ca_2(PO_4)_2$, $CaF_2$:Sb, $CaWO_4$ and $MgWO_4$; the phosphorescent film may include at least one or a compound of ZnCl, PtOEP, $Ir(piq)_3$, $Btp_2Ir(acac)$, $Ir(PPY)_3$, $Ir(PPy2)(acac)$, $Ir(mpyp)_3$, $F_2Irpic$, $(f2ppu)_2Ir(tmd)$ and $Ir(dfppz)_3$; and the magnetic film may include at least one or a compound of Ni, Co, $Fe_3O_4$, Pt, Pd, ferrite, soft ferrite, Mn—Zn ferrite, alnico ferrite, Nd—Fe—B and Samarium-Cobalt.

In accordance with yet another exemplary embodiment, an adhesive includes: at least one strand of fiber including a carrier polymer and a functional particle, wherein the functional particle is embedded in the carrier polymer to be physically fixed to the carrier polymer; and a binding resin forming a certain area with the fiber.

The carrier polymer may not be decomposed after synthesizing fiber.

The functional particle may include at least one of an electrically conductive particle, a far-infrared radiation particle, a fluorescent particle, a phosphorescent particle, and a magnetic particle.

The electrically conductive particle may include at least one or a compound of Ni, Ag, Cu, Au, Sn—Pb base, Sn—Ag base, Sn—Ag—Cu base, Sn—Bi base, Sn—Zn—Bi base, Sn—In base, Sn—Zn—Al base, and Sn—Bi—Ag base; the far-infrared radiation particle may include mullite containing $SiO_2$ or $Al_2O_3$ as a main component, cordierite, zircon, aluminotitanate-based and spodumene-based materials, $ZeO_2$, $Na_2O$, germanium compound (Ge, $GeI_4$, $GeO_2$), at least one or a compound of CeO, $K_2O$, LiO, $BO_3$, $Na_2O$, CaO and MgO, and a ceramic where one of CuO, $Fe_2O_3$, $MnO_2$, CoO and $TiO_2$ is added to mullite, cordierite, zircon, aluminotitanate and spodumene; the fluorescent particle may include at least one or a compound of ZnO, $Ca_2(PO_4)_2$, $CaF_2$:Sb, $CaWO_4$ and $MgWO_4$; the phosphorescent particle may include at least one or a compound of ZnCl, PtOEP, $Ir(piq)_3$, $Btp_2Ir(acac)$, $Ir(PPY)_3$, $Ir(PPy2)(acac)$, $Ir(mpyp)_3$, $F_2Irpic$, $(f2ppu)_2Ir(tmd)$ and $Ir(dfppz)_3$; and the magnetic particle may include at least one or a compound of Ni, Co, $Fe_3O_4$, Pt, Pd, ferrite, soft ferrite, Mn—Zn ferrite, alnico ferrite, Nd—Fe—B and Samarium-Cobalt.

The functional particle may be an electrically conductive particle, and a fiber embedding the electrically conductive particle may be physically broken so that an electric connection may be achieved through the electrically conductive particle.

Content of the electrically conductive particle may be approximately 1 wt % to approximately 50 wt % out of a whole weight.

The functional particle may include a polymer core; and a functional film coated on an outer surface of the polymer core.

The functional film coated on the polymer core may include at least one of an electric conductive film, a far-infrared radiation film, a fluorescent film, a phosphorescent film, and a magnetic film; the electric conductive film may include at least one or a compound of Ni, Ag, Cu, Au, Sn—Pb base, Sn—Ag base, Sn—Ag—Cu base, Sn—Bi base, Sn—Zn—Bi base, Sn—In base, Sn—Zn—Al base, and Sn—Bi—Ag base; the far-infrared radiation film may include mullite containing $SiO_2$ or $Al_2O_3$ as a main component, cordierite, zircon, aluminotitanate-based and spodumene-based materials, $ZeO_2$, $Na_2O$, germanium compound (Ge, $GeI_4$, $GeO_2$), at least one or a compound of CeO, $K_2O$, LiO, $BO_3$, $Na_2O$, CaO and MgO, and a ceramic where one of CuO, $Fe_2O_3$, $MnO_2$, CoO and $TiO_2$ is added to mullite, cordierite, zircon, aluminotitanate and spodumene; the fluorescent film may include at least one or a compound of ZnO, $Ca_2(PO_4)_2$, $CaF_2$:Sb, $CaWO_4$ and $MgWO_4$; the phosphorescent film may include at least one or a compound of ZnCl, PtOEP, $Ir(piq)_3$, $Btp_2Ir(acac)$, $Ir(PPY)_3$, $Ir(PPy2)(acac)$, $Ir(mpyp)_3$, $F_2Irpic$, $(f2ppu)_2Ir(tmd)$ and $Ir(dfppz)_3$; and the magnetic film may include at least one or a compound of Ni, Co, $Fe_3O_4$, Pt, Pd, ferrite, soft ferrite, Mn—Zn ferrite, alnico ferrite, Nd—Fe—B and Samarium-Cobalt.

The binding resin may include a subsidence part into which the fiber subsides to be arranged, and a bonding part formed in at least one of an upper region and a lower region of the subsidence part.

At least the subsidence part of the binding resin may be evenly formed.

A release film arranged at one or more sides of the binding resin may be included.

The binding resin may include at least one of epoxy, acryl, cyanate ester, and silicon polyurethane.

The adhesive may be selected from a conductive adhesive, an anisotropic conductive adhesive, and a nonconductive adhesive.

In accordance with still another exemplary embodiment, an electronic component on one side of which an electric connection part is formed includes: an adhesive bonded to the electric connection part, wherein the adhesive includes at least one strand of fiber including a carrier polymer and a functional particle, wherein the functional particle is embedded in the carrier polymer to be physically fixed to the carrier polymer, and a binding resin forming a certain area with the fiber.

The functional particle may be an electrically conductive particle.

The electrically conductive particle may include at least one of Ni, Ag, Cu, Au, Sn—Pb base, Sn—Ag base, Sn—Ag—Cu base, Sn—Bi base, Sn—Zn—Bi base, Sn—In base, Sn—Zn—Al base and Sn—Bi—Ag base, a compound of them, or a particle where an electric conductive film is coated on an outer surface of a polymer core.

The carrier polymer may include at least one or a compound of polyolefine, polystyrene, polyvinylalcohol, polyacrylonitrile, polyamide, polyester, aramide, acrylic, polythylene oxide (PEO), polycaprolactone, polycarbonate, polyethylene terephthalate, polybezimidazole (PBI), poly(2-hydroxyethylmethacrylate), polyvinylidene fluoride, poly(ether imide), styrene-butadiene-styrene triblock copolymer (SBS), poly(ferrocenyldimethylsilane), polyphenylenesulfide, and polyetheretherketone.

The binding resin may include at least one of epoxy, acryl, cyanate ester, and silicon polyurethane.

In accordance with yet still another exemplary embodiment, a method of manufacturing a fiber includes: preparing a solution including a functional particle and a carrier polymer; and drawing a fiber by spinning the solution.

At a process of the preparing the solution, the solution may be prepared by dispersing a functional particle to a solution where the carrier polymer is dissolved.

At a process of the drawing the fiber by spinning the solution, a method of electrospinning forming an electric field at a region to which the solution is spun may be used during spinning the solution.

The functional particle may include at least one of an electrically conductive particle, a far-infrared radiation particle, a fluorescent particle, a phosphorescent particle, and a magnetic particle.

The electrically conductive particle may include at least one of Ni, Ag, Cu, Au, Sn—Pb base, Sn—Ag base, Sn—Ag—Cu base, Sn—Bi base, Sn—Zn—Bi base, Sn—In base, Sn—Zn—Al base and Sn—Bi—Ag base, a compound of them, or a particle where an electric conductive film is coated on an outer surface of a polymer core.

The carrier polymer may include at least one or a compound of polyolefine, polystyrene, polyvinylalcohol, polyacrylonitrile, polyamide, polyester, aramide, acrylic, polythylene oxide (PEO), polycaprolactone, polycarbonate, polyethylene terephthalate, polybezimidazole (PBI), poly(2- hydroxyethylmethacrylate), polyvinylidene fluoride, poly (ether imide), styrene-butadiene-styrene triblock copolymer (SBS), poly(ferrocenyldimethylsilane), polyphenylenesulfide, and polyetheretherketone.

At a process of the drawing the fiber by spinning the solution, plural strands of the fiber may be regularly arranged or irregularly arranged forming a net structure.

In accordance with yet still another exemplary embodiment, a method of manufacturing an adhesive includes: preparing a solution including a functional particle and a carrier polymer; drawing a fiber by spinning the solution; and forming an adhesive by allowing the fiber to subside into a binding resin.

At a process of the drawing the fiber by spinning the solution, a method of electrospinning forming an electric field at a region to which the solution is spun may be used during spinning the solution.

The forming the adhesive may include preparing an adhesive film; arranging the fiber on the adhesive film; and allowing the fiber to subside into the adhesive film.

The preparing the adhesive film may include preparing a release film; and forming a binding resin layer by applying a binding resin solution on one side of the release film.

The allowing of the fiber to subside into the adhesive film may include applying heat and compressing pressure.

The allowing of the fiber to subside into the adhesive film may include allowing the fiber to subside into the binding resin layer of the adhesive film.

An electrically conductive particle is used for the functional particle.

The electrically conductive particle may include at least one of Ni, Ag, Cu, Au, Sn—Pb base, Sn—Ag base, Sn—Ag—Cu base, Sn—Bi base, Sn—Zn—Bi base, Sn—In base, Sn—Zn—Al base and Sn—Bi—Ag base, a compound of them, or a particle where an electric conductive film is coated on an outer surface of a polymer core.

The carrier polymer may include at least one or a compound of polyolefine, polystyrene, polyvinylalcohol, polyacrylonitrile, polyamide, polyester, aramide, acrylic, polythylene oxide (PEO), polycaprolactone, polycarbonate, polyethylene terephthalate, polybezimidazole (PBI), poly(2-hydroxyethylmethacrylate), polyvinylidene fluoride, poly (ether imide), styrene-butadiene-styrene triblock copolymer (SBS), poly(ferrocenyldimethylsilane), polyphenylenesulfide, and polyetheretherketone.

BRIEF DESCRIPTION OF THE DRAWINGS

Exemplary embodiments can be understood in more detail from the following description taken in conjunction with the accompanying drawings, in which:

FIGS. 10A to 10C and FIGS. 11A to 11C sequentially illustrate a method for manufacturing an adhesive according to the present disclosure;

DETAILED DESCRIPTION OF EMBODIMENTS

Figure 1:
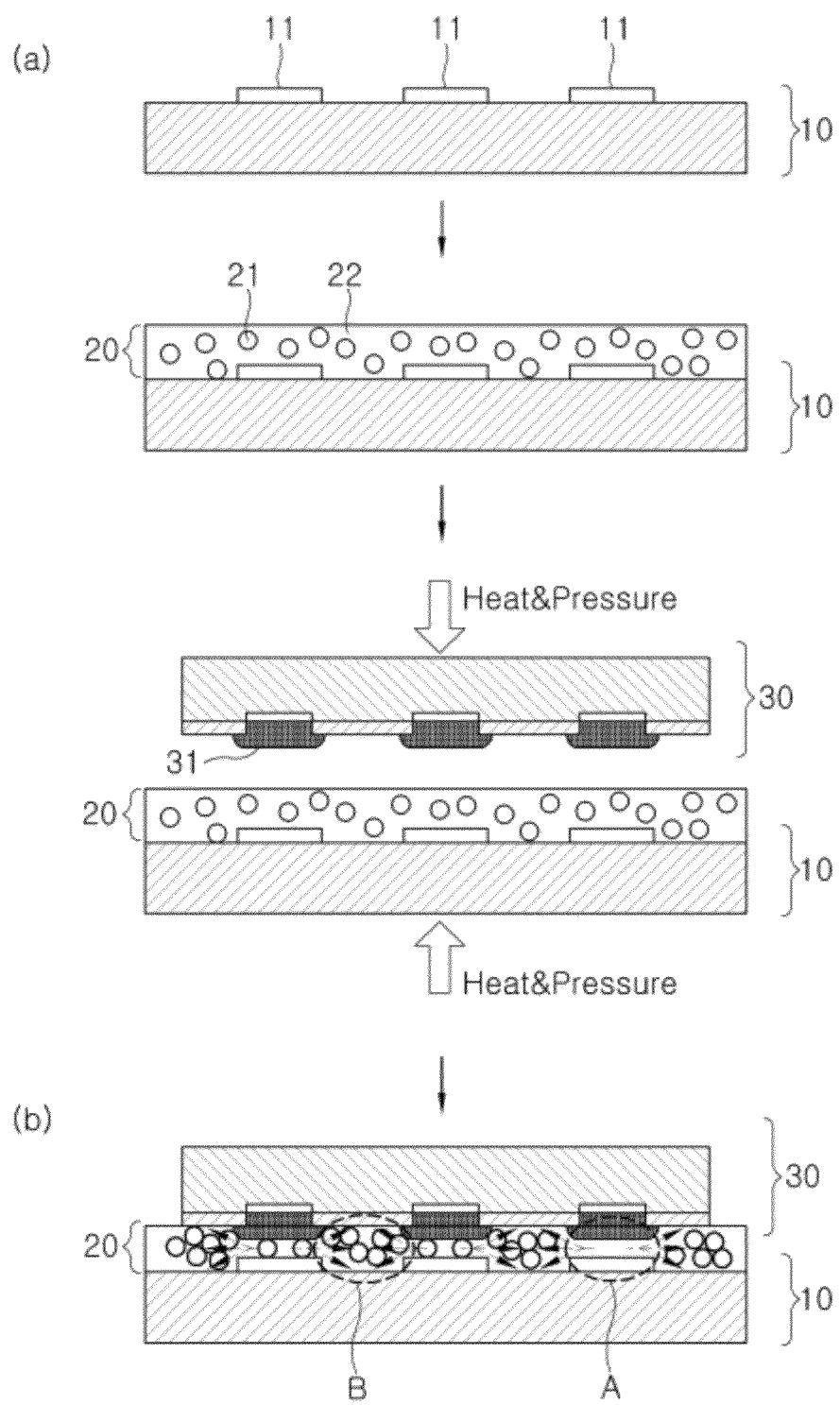
FIG. 1 illustrates a method of connecting two electronic components using a related art anisotropic conductive film.

Hereinafter, specific embodiments will be described in detail with reference to the accompanying drawings. The present invention may, however, be embodied in different forms and should not be construed as limited to the exemplary embodiments set forth herein. Rather, these embodiments are provided so that this disclosure will be thorough and complete, and will fully convey the scope of the present invention to those skilled in the art. Like reference numerals refer to like elements throughout.

Figure 2:
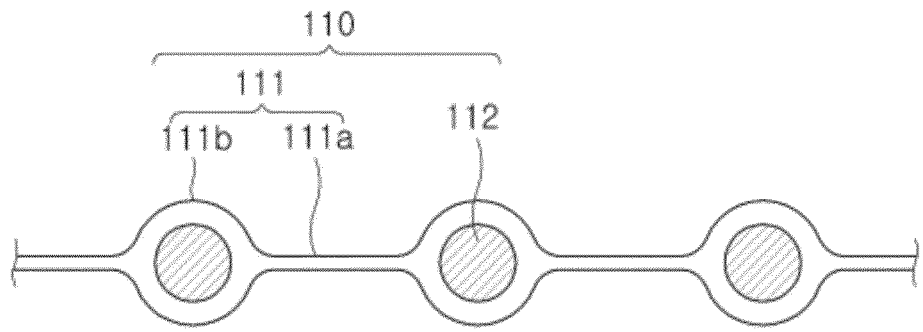
FIG. 2 is a cross-sectional view illustrating a fiber according to the present disclosure.
Figure 3:
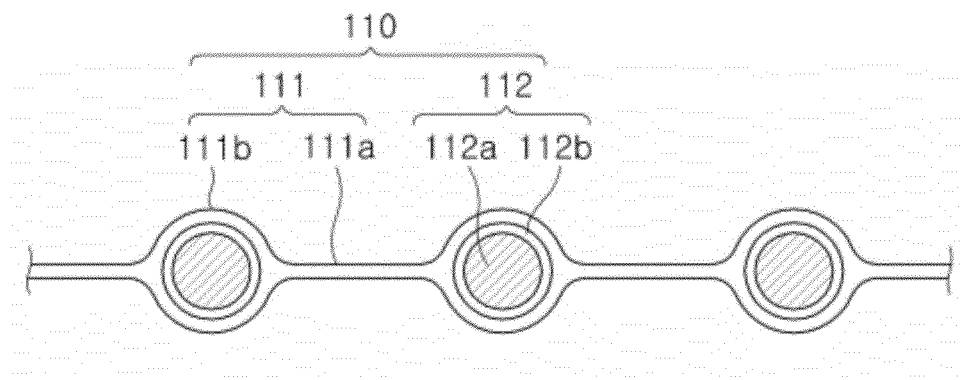
FIG. 3 is a cross-sectional view illustrating a fiber according to an exemplary modification of the present disclosure.
Figure 4:
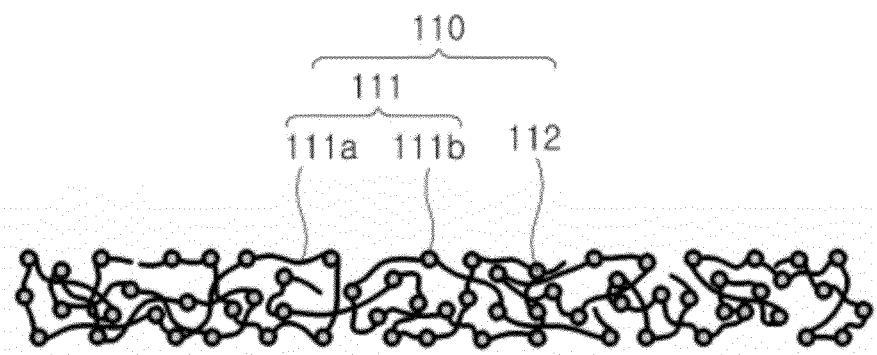
FIG. 4 is a diagram illustrating that fibers according to the present disclosure are irregularly arranged.
Figure 5:
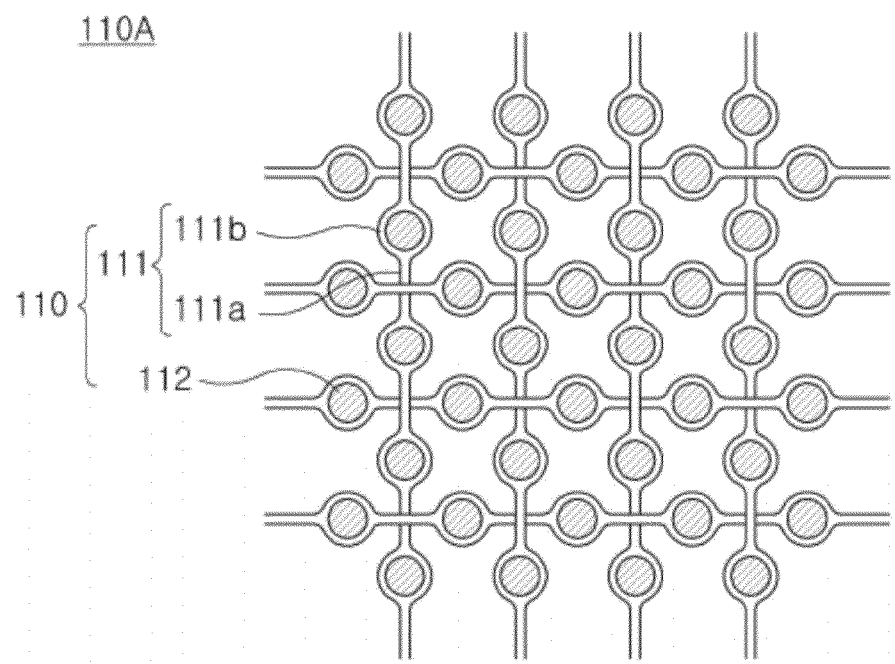
FIG. 5 is a diagram illustrating that fibers according to the present disclosure are regularly arranged.

FIG. 2 is a cross-sectional view illustrating a fiber according to the present disclosure, FIG. 3 is a cross-sectional view illustrating a fiber according to an exemplary modification of the present disclosure, FIG. 4 is a diagram illustrating that fibers according to the present disclosure are irregularly arranged, and FIG. 5 is a diagram illustrating that fibers according to the present disclosure are regularly arranged.

As illustrated in FIG. 2, a fiber 110 according to the present disclosure is extended in a length direction and includes a functional particle 112 to exhibit various characteristics. The fiber includes a plurality of functional particles 112 and a carrier polymer 111 which embeds and fixes the plurality of functional particles 112 and extends in a length direction.

The functional particle 112 includes a material having a certain function according to a user's purpose. Accordingly, the functional particle 112 may be materials showing electromagnetic properties, optical properties, etc. That is, for instance, the functional particle 112 may be fabricated using materials which have electrical conductivity, magnetic properties, far-infrared radiation, fluorescence, and phosphorescence.

For example, electrically conductive particles may include at least one of Ni, Ag, Cu, Au, Sn—Pb base, Sn—Ag base, Sn—Ag—Cu base, Sn—Bi base, Sn—Zn—Bi base, Sn—In base, Sn—Zn—Al base, and Sn—Bi—Ag base, or a compound thereof.

And, far-infrared radiation particles may include mullite mainly containing $SiO_2$ or $Al_2O_3$, cordierite, zircon, aluminotitanate-based and spodumene-based materials, $ZeO_2$, $Na_2O$, germanium compound (Ge, $GeI_4$, $GeO_2$), at least one or a compound of CeO, $K_2O$, LiO, $BO_3$, $Na_2O$, CaO and MgO, and a ceramic where one of CuO, $Fe_2O_3$, $MnO_2$, CoO and $TiO_2$ is added to mullite, cordierite, zircon, aluminotitanate and spodumene.

Also, fluorescence radiation particles may include at least one or a compound of ZnO, $Ca_2(PO_4)_2$, $CaF_2$:Sb, $CaWO_4$ and $MgWO_4$.

And, phosphorescence radiation particles may include at least one or a compound of ZnCl, PtOEP, Ir(piq)$_3$, Btp$_2$Ir (acac), Ir(PPY)$_3$, Ir(PPy2)(acac), Ir(mpyp)$_3$, F$_2$Irpic, (f2ppu)$_2$Ir(tmd) and Ir(dfppz)$_3$.

Also, magnetic particles may include at least one or a compound of Ni, Co, Fe$_3$O$_4$, Pt, Pd, ferrite, soft ferrite, Mn—Zn ferrite, alnico ferrite, Nd—Fe—B and Samarium-Cobalt.

Meanwhile, the functional particles 112 may be realized in various ways not being limited to particles having certain functions in themselves.

For instance, as illustrated in FIG. 3, the functional particle 112 may include a polymer core 112a and a functional layer 112b coating an outer surface of the polymer core 112a. That is, for the modified functional particle 112, the functional layer 112b having a certain function coats an outer surface of the polymer core 112a. Accordingly, a function of the functional particle 112 is exhibited by the functional layer 112b. Herein, the polymer core 112a may be fabricated using polymethylmethacrylate (PMMA), polystyrene, benzoquanamine, acrylic copolymer and the like, and the functional layer 112b may be fabricated using materials having electrical conductivity, magnetic properties, far-infrared radiation, fluorescence, and phosphorescence. For the functional layer 112b, materials used as the above-mentioned functional particles may be selectively used.

The carrier polymer 111 physically fixes the functional particles by surrounding the plurality of functional particles 112. It is preferable that the carrier polymer 111 is not decomposed (flowing like liquid) during a following process after manufacturing the fiber 110. Therefore, a free movement of the functional particle 112 may be suppressed because the functional particle 112 is embedded and fixed by the carrier polymer 111.

Herein, the carrier polymer 111 may be divided into a region which surrounds each outer surface of the plurality of functional particles 112 and a region which is extended in a length direction. Hereinafter, for convenience, the region coating an outer surface of the functional particle 112 is named a coating part 111b, and the region except for the coating part 111b, which connects a plurality of coating parts 111b, is named an extension part 111a. Although it is described that the carrier polymer 111 is divided into the extension part 111a and the coating part 111b for convenience, the extension part 111a and the coating part 11b are connected to each other in a body.

It is preferable to adjust a thickness of the coating part 111b for appropriately fixing the functional particle 112 without hindering functions.

A length of the extension part 111a may be varied with the content of the functional particle 112.

The coating part 111b may be physically broken due to an external environment change during a following process where an adhesive is used so that the functional particle 112 is exposed to thereby exhibit characteristic functions of the functional particle 112. For example, in the case of an electric anisotropic adhesive where a conductive particle is used for the functional particle 112, the coating part 111b is physically broken thereby exposing the electrically conductive particle due to a thermocompression bonding process when electric connection parts of electronic components are bonded using the electric anisotropic adhesive. Due to the exposed electrically conductive particle, the electric connection parts of electronic components are connected so that an electric connection is achieved.

For the carrier polymer 111, it is preferable to use materials not hindering characteristics of the functional particle 112. For instance, at least one or a compound of polyolefine, polystyrene, polyvinylalcohol, polyacrylonitrile, polyamide, polyester, aramide, acrylic, polythylene oxide (PEO), polycaprolactone, polycarbonate, polyethylene terephthalate, polybezimidazole (PBI), poly(2-hydroxyethylmethacrylate), polyvinylidene fluoride, poly(ether imide), styrene-butadiene-styrene triblock copolymer (SBS), poly(ferrocenyldimethylsilane), polyphenylenesulfide, and polyetheretherketone.

Meanwhile, the fiber 110 may be configured as one strand. However, a plurality of fibers 110 may be tangled to form a net structure which may effectively suppress the movement of the functional particle 112 included in the fiber 110 may. Hereinafter, for convenience, the structure where the fibers 110 are tangled is named a fiber aggregate 110A.

In the fiber aggregate 110A, the fibers 110 may be irregularly tangled (unwoven), or may be regularly arranged (woven) forming a net structure. That is, the fiber aggregate 110A may be in a state where the fibers 110 are disorderedly tangled as illustrated in FIG. 4. Alternatively, as illustrated in FIG. 5, the fiber aggregate 110A may have a structure where some of the fibers 110 are arranged in a horizontal direction and the others are arranged in a vertical direction. Preferably, the fiber aggregate 110A may have a fabric structure where the fibers 110 are arranged according to the arrangement of wefts and warp threads.

The fibers 110 may subside into a later-described binding resin 210 of an adhesive 300 (refer to FIG. 6) to have a certain thickness and an area. Accordingly, mechanical strength of the fiber aggregate 110A may be improved.

Next, an adhesive including the fiber 110 or the fiber aggregate 110A is described.

Figure 6:
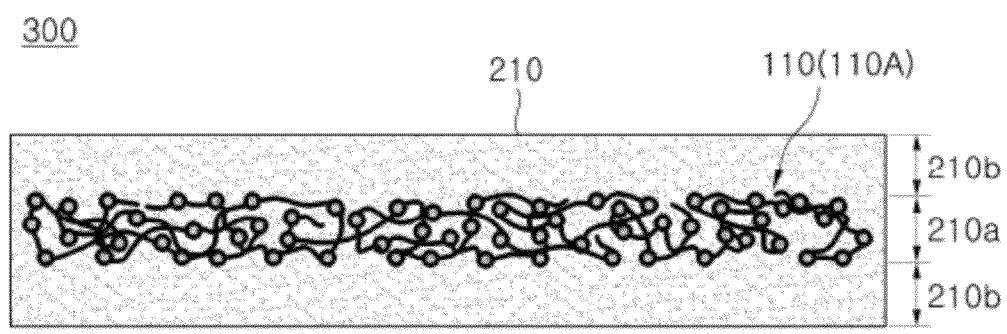
FIG. 6 is a diagram illustrating an adhesive according to an exemplary embodiment of the present disclosure.

FIG. 6 is a diagram illustrating an adhesive according to an exemplary embodiment of the present disclosure.

As illustrated in FIG. 6, the adhesive 300 according to the exemplary embodiment of the present disclosure includes: at least one strand of fiber 110 including a carrier polymer 111 and a functional particle 112 physically fixed to the carrier polymer 111 which is embedded by the carrier polymer 111; and a binding resin 210 forming a certain area with the fiber 110.

For the fiber 110, the above-described fiber 110 or fiber aggregate 110A is used, and duplicate descriptions are omitted.

The binding resin 210 includes a subsidence part 210a where the fiber 110 subsides into the binding resin 210 and is arranged to form a certain area; and a bonding part 210b formed in at least one of an upper region and a lower region of the subsidence part 210a.

The subsidence part 210 is a region of the binding resin 210 where the fiber 110 subsides and is formed at an approximately middle region of the binding resin 210.

The bonding part 210b is a region where the fiber 110 does not subside into the binding resin 210, and forms a surface of the subsidence part 210. At a following process, the bonding part 210b serves to adhere to an electronic component or bond electronic components when the electronic components are connected to each other. It is preferable that at least the subsidence part 210a be formed evenly in the binding resin 210. This makes it easy for the binding resin 210 to adhere to electronic components.

As described above, the fiber 110 is concentratedly distributed in the subsidence part 210a of the binding resin 210, and the bond between electronic components is achieved by the bonding part 210b. Therefore, even though a small amount of the fiber 110 is included in the resin 210, adhesive strength can be improved and various functions caused by the fiber 110 can be sufficiently exhibited as well.

For the binding resin 210, various materials for allowing the fiber 110 to easily subside and for maintaining adhesive strength after a following process may be used. Preferably, thermosetting resin or photocurable resin hardened by external stimulus such as heat or light may be used. For instance, the binding resin 210 may have a monomer form initially, and then, may become polymer during cross-linking at a thermocompression bonding process. Accordingly, the binding resin 210 may include at least one of epoxy, acryl, cyanate ester and silicon polyurethane, or a mixture thereof.

Meanwhile, the above-described adhesive 300 may include not only the fiber 110 and the binding resin 210 but also a release film 220 for easily manufacturing and using adhesive.

Figure 7:
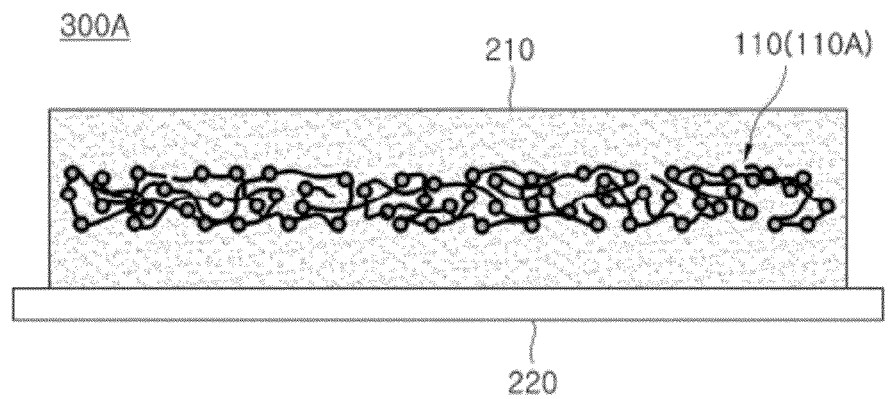
FIG. 7 is a diagram illustrating an adhesive according to a modified embodiment of the present disclosure.

FIG. 7 illustrates an adhesive according to a modified embodiment of the present disclosure. As illustrated in FIG. 7, an adhesive 300A according to the modified embodiment of the present disclosure includes a release film 220, a binding resin 210 disposed at one side of the release film 220, and a fiber 110 subsiding into the binding resin 210. That is, the adhesive 300A according to the modified embodiment of the present disclosure includes the binding resin 210 and the fiber 110 like the previous exemplary embodiment. However, the adhesive 300A according to the modified embodiment further includes the release film 220 which is additionally attached to one side of the binding resin 210. Although it is described that the release film 220 is attached to one side of the binding resin 210 in the modified embodiment of the present disclosure, the present invention is not limited thereto. Thus, the release film 220 may be attached to one side and the other side of the binding resin 210.

Although the above-described adhesive is a film type, the adhesive is not limited thereto and may be formed in various types such as a paste type.

Also, the adhesive may be a conductive adhesive, an anisotropic conductive adhesive, and a nonconductive adhesive.

An electronic component including the above-described adhesive 300 is described below.

Figure 8:
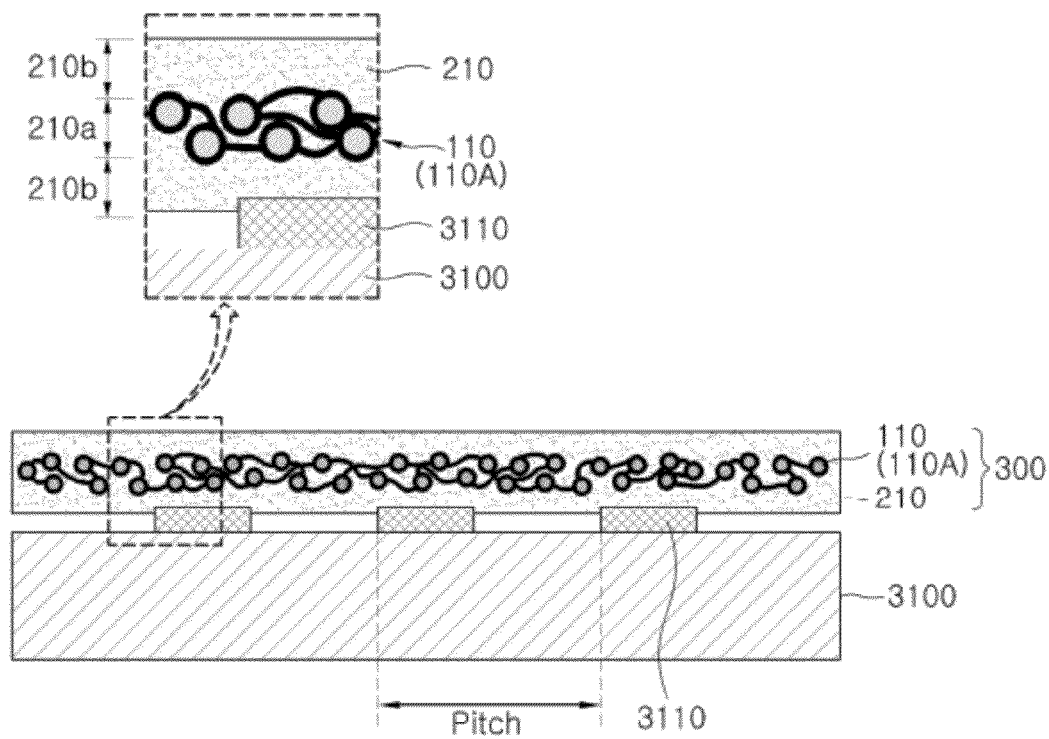
FIG. 8 is a diagram illustrating an electronic component according to an exemplary embodiment of the present disclosure.

FIG. 8 illustrates an electronic component according to an exemplary embodiment of the present disclosure.

As illustrated in FIG. 8, an electric connection part 3110 is formed on one side of an electronic component 3100 according to an exemplary embodiment of the present disclosure. The electronic component 3100 includes an adhesive 300 adhering to the electric connection part 3110.

For the adhesive 300, the above-described adhesive 300 including the above-described fiber 110 or the fiber aggregate 110A is used, and duplicate descriptions are thus omitted herein.

The electric connection part 3110 of the electronic component 3100 is merely bonded to one side of the binding resin 210 of the adhesive 300. Preferably, the electric connection part 3110 of the electronic component 3100 partly subsides into the bonding part 210b of the binding resin 210 to be bonded.

Next, a method for manufacturing the adhesive according to an exemplary embodiment of the present disclosure is described.

Figure 9:
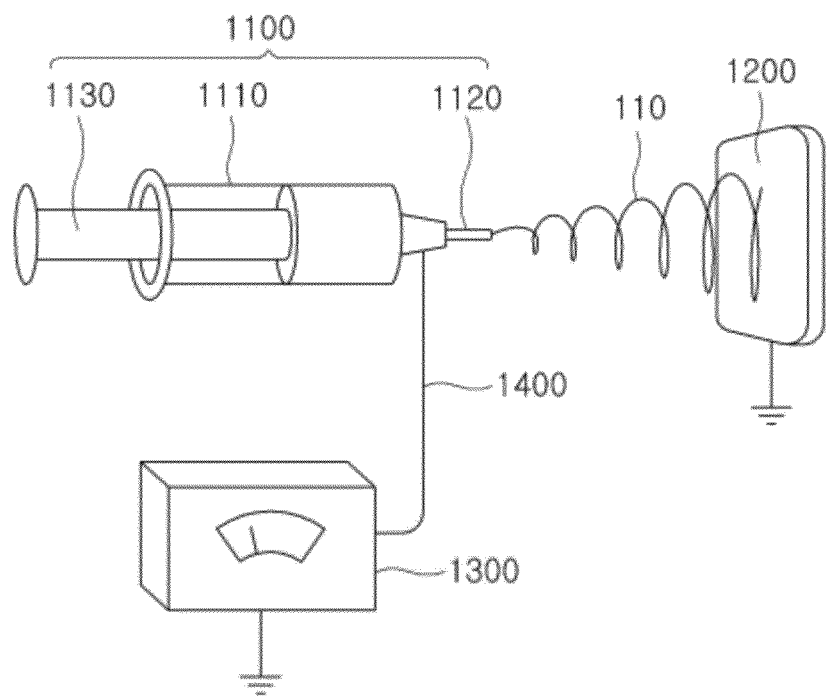
FIG. 9 is a diagram illustrating a device for manufacturing a fiber according to the present disclosure.
Figure 10A:
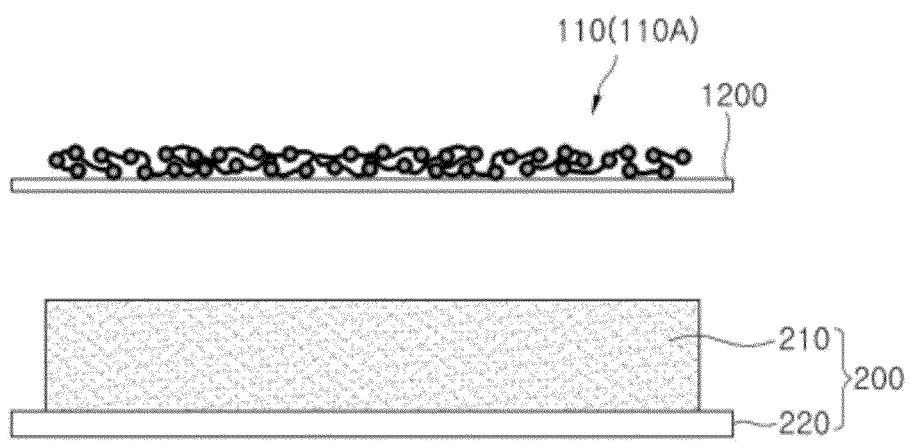
Figure 10B:
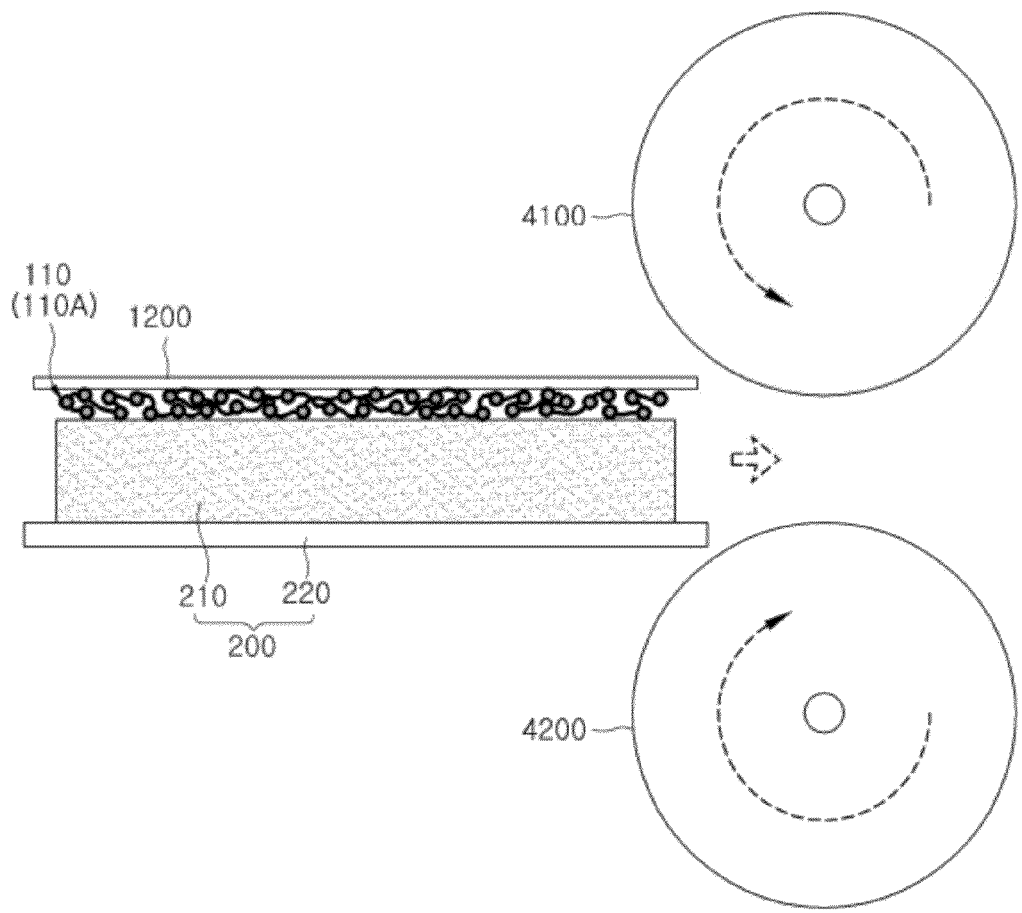
Figure 10C:
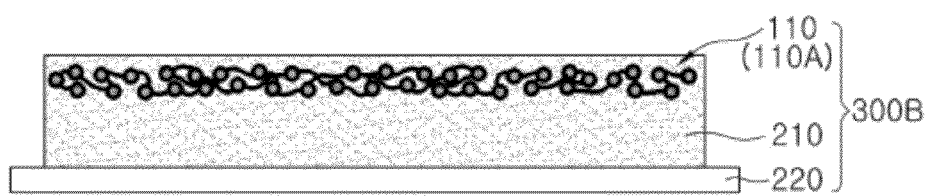

FIG. 9 illustrates a fiber manufacturing device according to the present disclosure, and FIGS. 10A to 10C sequentially illustrate a method for manufacturing the adhesive according to the present disclosure.

Firstly, the fiber manufacturing device is described with reference to FIG. 9.

As illustrated in FIG. 9, a fiber manufacturing device 1000 spins contents by an electrospinning method. The fiber manufacturing device 1000 includes a spinning module 1100; a metal foil 1200 arranged corresponding to one side of the spinning module 1100, where a fiber 110 spun from the spinning module 1100 is collected; a power supply unit 1300 for applying power to the spinning module 1100; and a power line 1400 one terminal of which is connected to the power supply unit 1300 and the other terminal of which is connected to the spinning module 1100.

The spinning module 1100 includes a syringe 1110 where an internal space for accommodating a functional fiber manufacturing mixture (mixed solution of carrier polymer solution and functional particles) is provided; a needle 1120 which is arranged at one side of the syringe 1110 and spins the functional fiber manufacturing mixture; and a pressure adjusting member 1130 for moving the mixture in the syringe 1110 to the needle 1120 by adjusting pressure in the syringe 1110.

Herein, it is preferable that an opening of the needle 1120 facing the metal foil 1200 has a larger diameter than the functional particle 112, and the other terminal of the power line 1400 is connected being adjacent to the needle 1120. In the exemplary embodiment, a cylinder reciprocally moving in the syringe 1110 is used as the pressure adjusting member 1130 adjusting pressure in the syringe 1110. However, although not limited thereto, various methods for adjusting pressure in the syringe 1110 may be used.

A method for manufacturing a fiber using the fiber manufacturing device is described.

Firstly, a carrier polymer solution is prepared, and the functional particle 112 is dispersed in the carrier polymer solution. Hereinafter, the solution where the carrier polymer solution and the functional particle 112 are mixed is named 'functional fiber manufacturing mixture'. In the exemplary embodiment, a solution where polyacrylonitrile is mixed with an organic solvent is used as the carrier polymer solution.

When the carrier polymer solution and the functional particle 112 are mixed, a thickness of the coating part 111b embedding the functional particle 112 and viscosity of the functional fiber manufacturing mixture may be adjusted according to a weight ratio between the carrier polymer solution and the functional particle 112. In detail, a thickness of the coating part 111b is determined according to a ratio between polymer and organic solvent forming the carrier polymer solution.

For example, in the case of using an electrically conductive particle for the functional particle 112, electrical conductivity and contact resistance of the adhesive 300 may be adjusted due to a thickness of the coating part 111b embedding the functional particle 112.

After the functional fiber manufacturing mixture is prepared, the functional fiber manufacturing mixture is injected into the syringe 1110 of the spinning module 1100. And, by adjusting pressure in the syringe 1110 by the pressure adjusting member 1130, the mixture in the syringe 1110 is ejected to the outside through the needle 1120. In the exemplary embodiment, since a cylinder is used for the pressure adjusting member 1130, the cylinder is moved in an arrangement direction of the syringe 1110 so that the functional fiber manufacturing mixture is discharged from the needle 1120.

Herein, the power supply unit 1300 and the power line 1400 are used to apply power to a region adjacent to the needle 1120 where the functional fiber manufacturing mixture is ejected, and the metal foil 1200 is grounded. At this time, an electric field is generated between the spinning module 1100 and the metal foil 1200, and the functional fiber manufacturing mixture discharged from the spinning module 1100 is spun toward the metal foil 1200. Accordingly, the fiber 110 is manufactured, which includes the carrier polymer 111 extended in a length direction and the functional particle 112.

Herein, the functional particle 112 is coated with the carrier polymer 111. That is, the functional particle 112 is physically fixed by the carrier polymer 111 to be integrated.

Herein, a diameter of the fiber 110, preferably, a diameter of the extension part 111a and a thickness of the coating part 111b are adjusted according to a diameter of the needle 1120 of the fiber manufacturing device 1000, viscosity of the functional fiber manufacturing mixture, intensity of power applied to the spinning module 1100, and pressure applied to the syringe 1110 by the pressure adjusting member 1130. Therefore, by adjusting a diameter of the needle 1120, viscosity of the functional fiber manufacturing mixture, intensity of applied power, and pressure of the syringe 1110, the fiber 110 may be manufactured having a diameter of the extension part 111a and a thickness of the coating part 111b desired by an operator.

In the above-described method, the fiber 110 is consecutively spun to the metal foil 1200 using the spinning module 1100 so that a net structure where the fiber 110 is gathered and tangled at the metal foil 1200, i.e., the fiber aggregate 110A, may be formed.

The adhesive 300 is manufactured using the fiber 110 or the fiber aggregate 110A.

FIGS. 10A to 10C and FIGS. 11A to 11C sequentially illustrate a method for manufacturing an adhesive according to the present disclosure.

As illustrated in FIG. 10A, the fiber 110 supported by the metal foil 1200 is manufactured through the electrospinning method using the fiber manufacturing device 1000, and an adhesive film 200 is prepared separately from the fiber 110. Although the metal foil 1200 is directly used for supporting the fiber 110, it is not limited thereto and thus a special support member may also be used.

The adhesive film 200 is prepared by applying the binding resin 210 on the release film 220 with a certain area. For instance, an epoxy solution is applied on one side of the release film 220 and is heated to thereby manufacture a film having a certain thickness. Therefore, as illustrated in FIG. 10A, the adhesive film 200, where the binding resin 210 is layered on one side of the release film 220, is manufactured.

After the fiber 110 and the adhesive film 200 are prepared, the binding resin 210 of the adhesive film 200 is positioned to face the fiber 110 as illustrated in FIG. 10B. Then, lamination is performed on the adhesive film 200 and the fiber 110 facing each other to thereby manufacture an adhesive 300B. For instance, by passing the adhesive film 200 and the fiber 110 facing each other between a pair of compression rollers 4100 and 4200, the fiber 110 subsides into the binding resin 210 as illustrated in FIG. 10C. Herein, the fiber 110 is made to uniformly subside into the binding resin 210 without physical damage by appropriately adjusting a lamination atmosphere, e.g., heating temperature and compressing pressure. Also, by adjusting the heating temperature and compressing pressure, a position of the fiber 110 in the binding resin 210 may be adjusted, and accordingly, thicknesses of the subsidence part 210a and the bonding part 210b of the binding resin 210 may be adjusted.

However, as illustrated in FIG. 10C, it is limited to allow the fiber 110 to subside into a center region of the binding resin 210 in the adhesive 300B manufactured through one-time lamination.

To allow the fiber to subside into a center region of the binding resin, it is preferable to perform lamination multiple times.

After the adhesive 300B is prepared through the above-described method illustrated in FIGS. 10A to 10C, an adhesive film 400 is prepared separately from the adhesive 300B as illustrated in FIG. 11A. Herein, the adhesive film 400 is prepared by applying a binding resin 410 on a release film 420 with a certain area.

Figure 11B:
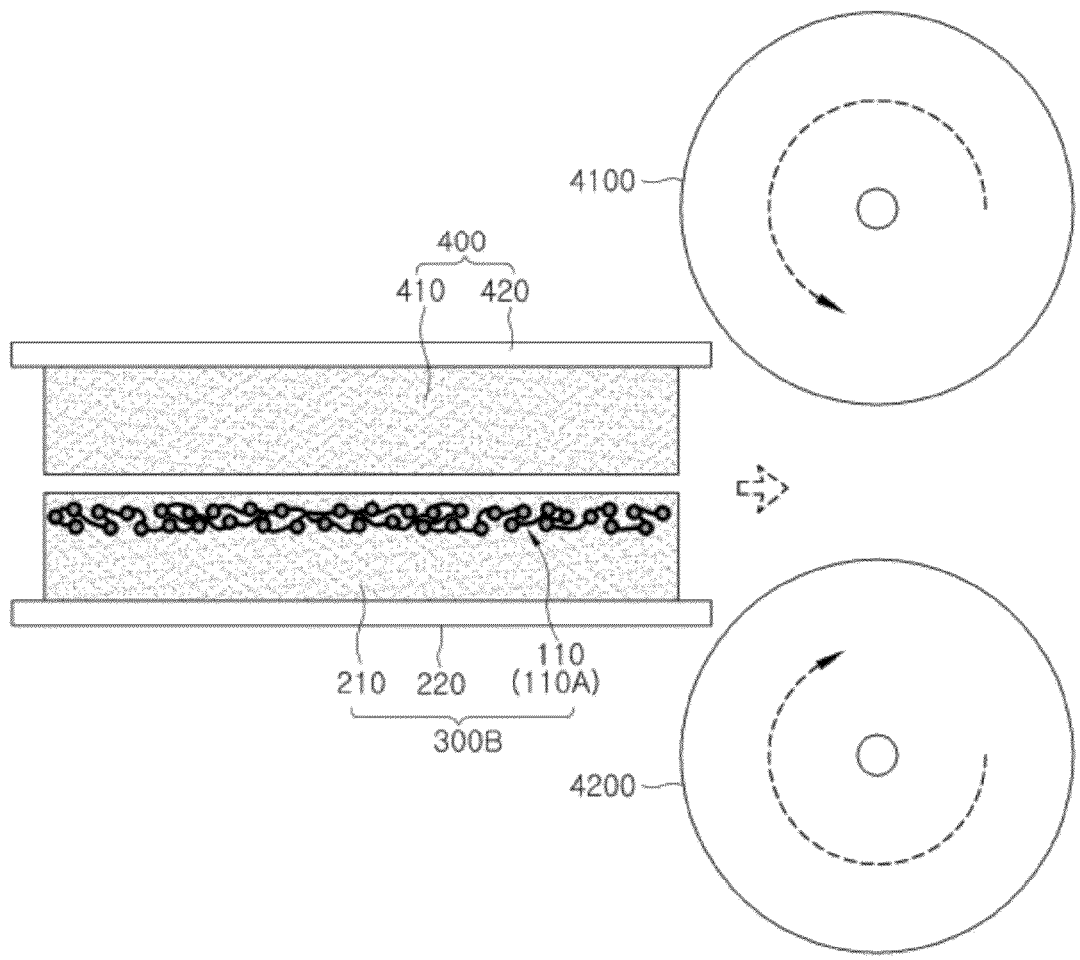

After the adhesive 300B and the adhesive film 400 are prepared, the binding resin 210 of the adhesive 300B is positioned to face the binding resin 410 of the adhesive film 400 as illustrated in FIG. 11B. Then, lamination is performed on the adhesive 300B and the adhesive film 400 facing each other.

Figure 11C:
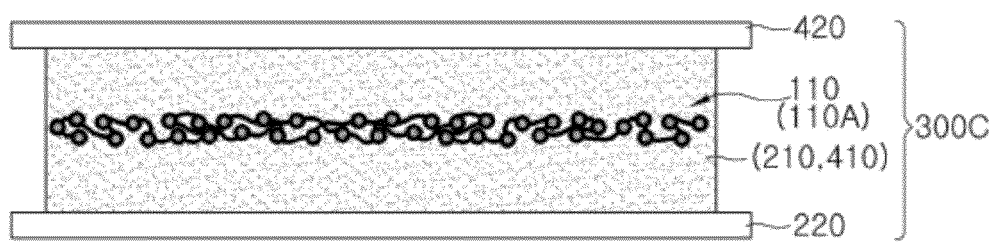

Then, the binding resin 410 of the adhesive film 400 is mixed with an upper region of the binding resin 210 mixed with the fiber 110 as illustrated in FIG. 11C. Therefore, an adhesive 300C, where the fiber 110 is disposed at a center region of the mixed binding resins 210 and 410, may be manufactured.

In the above-described method, lamination is performed using the compression rollers 4100 and 4200; however, various apparatuses capable of applying pressure to the fiber 110 and the binding resins 210 and 410, e.g., a compression applying plate of a plate form, may be used.

Meanwhile, the adhesive 300 may be formed in a paste form having liquidity. For instance, liquefied carrier polymer and a fiber are mixed with each other to manufacture an adhesive manufacturing mixture, and the mixture is heated at a certain temperature to increase viscosity so that an adhesive of a paste form may be manufactured. And, such a paste type adhesive may be used in a method of application using a dispenser which discharges and dispenses processing materials.

Next, specific structures of the fiber and the adhesive according to an exemplary embodiment of the present disclosure are described.

Figure 12:
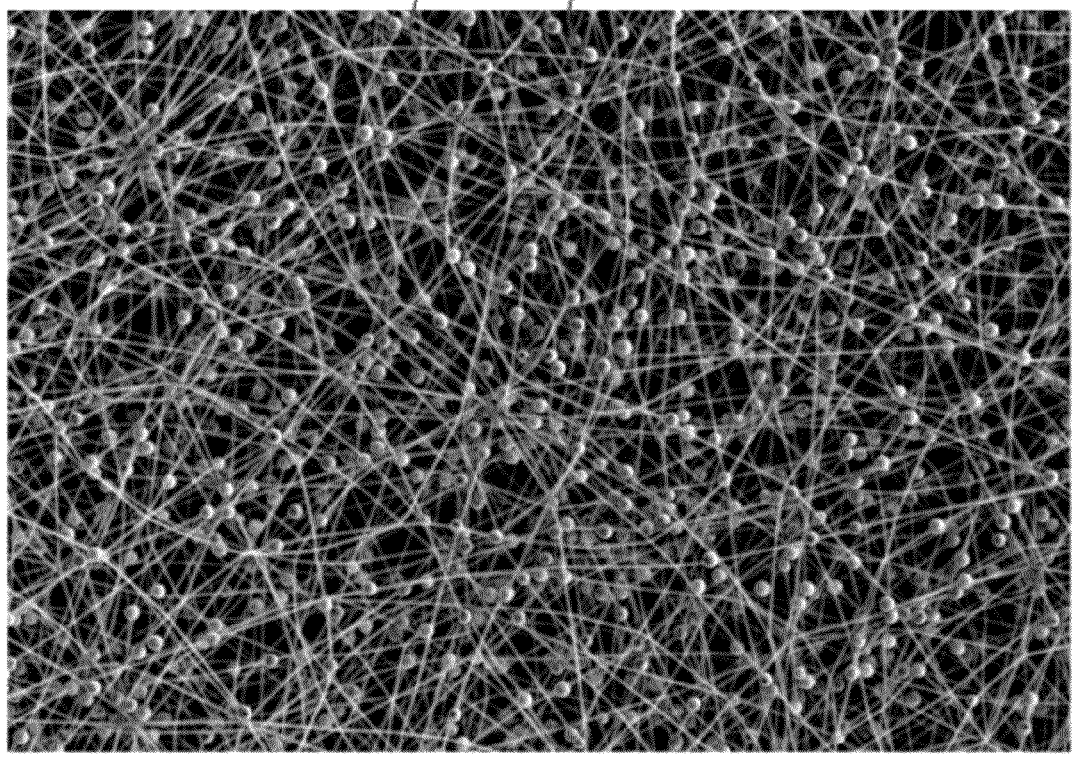
FIG. 12 is a magnified image of the fiber according to an exemplary embodiment of the present disclosure.
Figure 13A:
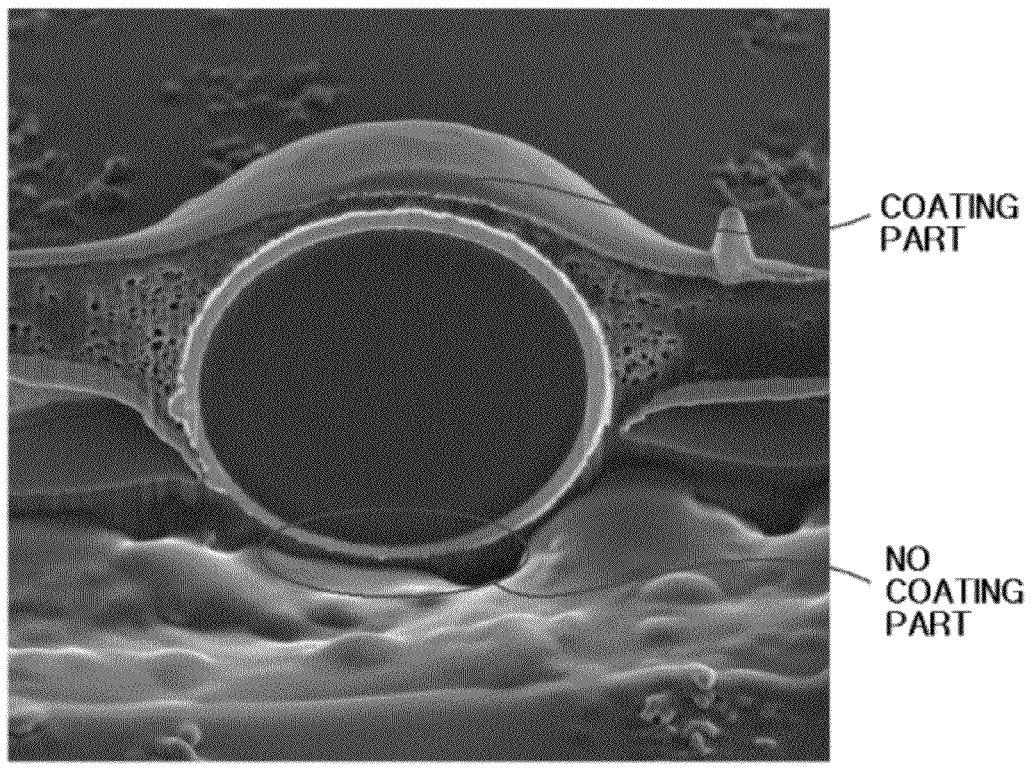
FIGS. 13A and 13B are magnified images for describing a relation between a thickness of a coating part surrounding a functional particle and a diameter of the functional particle.
Figure 13B:
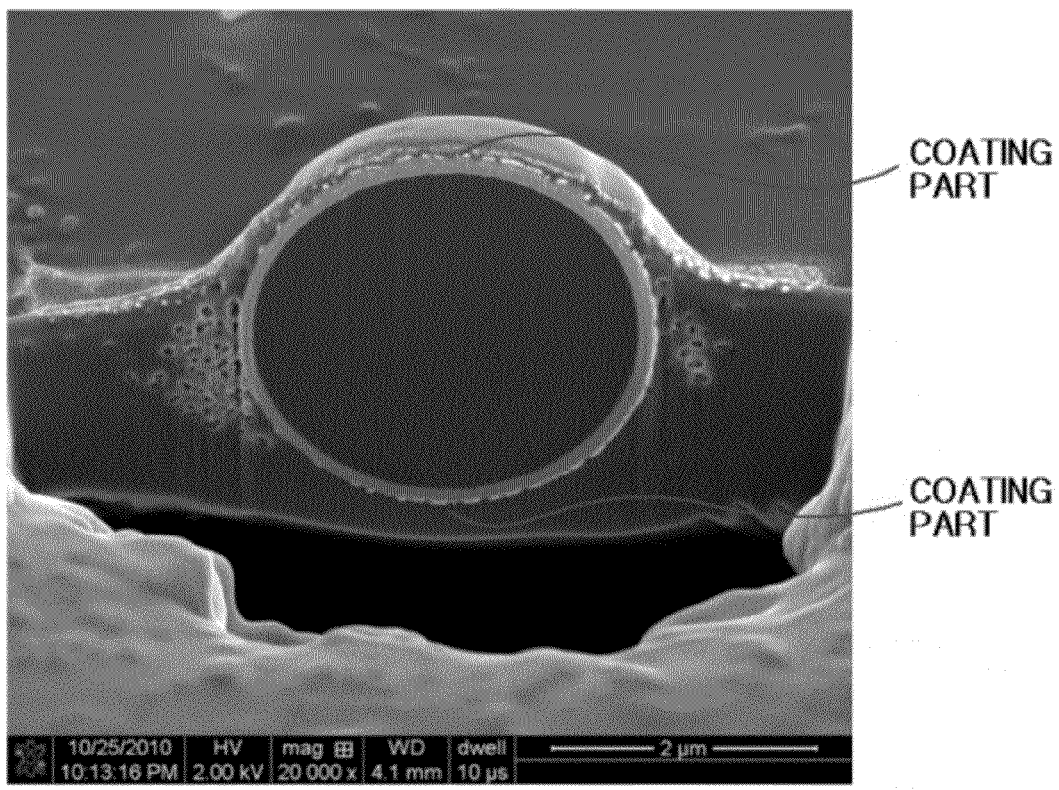

FIG. 12 is a magnified image of the fiber according to the present disclosure, and FIGS. 13A and 13B are magnified images for describing a relation between a thickness of the coating part embedding the functional particle and a diameter of the functional particle.

For using the adhesive 300 according to the exemplary embodiment of the present disclosure as an adhesive for bonding electronic components, e.g., a particle having a polymer core coated with Ni film with excellent electrical conductivity is used for the functional particle 112. Herein, the Ni film may be coated with an Au film for preventing oxidation. And, PMMA is used for the polymer core, and nonconductive material PAN is used for the carrier polymer. Accordingly, the functional particle exhibits an electric conductive function due to the functional film, i.e., the Ni film.

It is preferable to appropriately adjust a diameter of the functional particle 112 corresponding to a size of an electric connection part of an electronic component and a distance to a neighboring electric connection part. For instance, in the case of bonding with a width of approximately 200 μm and a distance of approximately 200 μm (pitch of approximately 400 μm, refer to FIG. 8) between electric connection parts, a relatively large conductive particle, e.g., an electrically conductive particle having a diameter of approximately 20 μm, may be used. Also, in the case where a distance between electric connection parts is a fine pitch ranging from approximately 20 μm to approximately 30 μm, the functional particle 112 having a diameter of approximately 3 μm may be used. Therefore, it is good to use the functional particle 112 for ACA (Anisotropic Conductive Adhesives) having a diameter ranging from approximately 0.1 μm to approximately 50 μm for bonding electronic components. More preferably, it is good to use the functional particle 112 for ACA having a diameter ranging from approximately 0.1 μm to approximately 20 μm.

Also, it is preferable that the carrier polymer 111 and the functional particle 112 included in the fiber 110 maintain a certain weight ratio for achieving the best efficiency even though a small amount of the functional particle 112 is used. For instance, it is preferable that a weight ratio between the carrier polymer 111 and the functional particle 112 is approximately 1:0.25~25. That is, in the case where a weight ratio of the functional particle 112 is too smaller than approximately 0.25 wt %, electrical conductivity cannot be sufficiently exhibited. In the case where a weight ratio of the functional particle 112 is too greater than approximately 25, a defect of short may occur when electronic components are bonded to each other, and manufacturing cost is increased because a large amount of functional particles is unnecessarily used.

As an example, FIG. 12 is a magnified image illustrating the fiber when a weight ratio between the carrier polymer 111 and the functional particle 112 is approximately 1:2.5. As illustrated in FIG. 12, it may be confirmed that the functional particles 112 are arranged at appropriate intervals when a weight ratio between the carrier polymer 111 and the functional particle 112 is approximately 1:2.5. At this time, electrical conductivity is excellent. Of course, when far-infrared radiation particles, fluorescent particles, phosphorescent particles, or magnetic particles are used for the functional particle 112 instead of the functional particle 112, a ratio of carrier polymer to functional particle may be appropriately adjusted.

Also, a thickness of the coating part 111b in the carrier polymer 111 embedding the functional particle 112 is an important factor which determines electrical conductivity and contact resistance of the adhesive 300. It is preferable that a thickness of the coating part 111b maintains approximately 0.1% to approximately 50% of a radius of the functional particle 112.

As an example, FIG. 13A is a magnified image illustrating the fiber 110 when a thickness of the coating part 111b embedding the functional particle 112 is less than approximately 0.1% of a radius of the functional particle 112, and FIG. 13B is a magnified image illustrating the fiber 110 when a thickness of the coating part 111b embedding the functional particle 112 is approximately 0.1% to approximately 50% of a radius of the functional particle 112.

In the case where a thickness of the coating part 111b embedding the functional particle 112 is smaller than approximately 0.1% of a radius of the functional particle 112, the coating part 111b may not exist on a portion of an outer surface of the functional particle 112 as illustrated in FIG. 13A. That is, a portion of an outer surface of the functional particle 112 is exposed and the other portion is coated with the coating part 111b. Therefore, the functional particle 112 may not be stably fixed to the carrier polymer 111, thereby influencing a following process. As a result, in the case where the coating part 111b does not exist partially, and thus neighboring functional particles 112 contact each other, an electrical short may occur due to the neighboring functional particles at a region where an electric connection is not desired.

On the contrary, although not illustrated in the drawings, in the case where a thickness of the coating part 111b embedding the functional particle 112 is more than approximately 50% of a radius of the functional particle 112, the coating part 111b is not easily broken during thermocompression, leading to an increase in contact resistance. For instance, if the coating part 111b embedding the functional particle 112 is not easily broken when thermocompression is performed for bonding a pair of bond objects using an adhesive (not illustrated) including the fiber 110, the functional particle 112 of which coating part 111b is not broken is located at a region between the pair of bond objects where an electric connection should be achieved, and thus contact resistance between the pair of bond objects and the functional particle 112 is increased. Such an increase in contact resistance causes degradation of electrical conductivity between the pair of bond objects.

Therefore, according to the present disclosure, a thickness of the coating part 111b embedding the functional particle 112 is made to be approximately 0.1% to approximately 50% of a radius of the functional particle 112 so that the coating part 111b embeds the functional particle relatively uniformly and the coating part 111b is easily broken during thermocompression as illustrated in FIG. 13B.

Meanwhile, it is preferable that a diameter of the extension part 111a of the fiber 111 is approximately 10 nm to approximately 100 μm considering production quality during manufacture of an adhesive, or production processability during a thermocompression bonding process. For physically fixing distances between the coating parts 111b embedding the functional particles 112 with the maintenance of dispersed state, a diameter of the extension part 111a of the fiber 111 is limited as described above. For example, in the case of using an electrically conductive particle having a diameter of approximately 20 μm for the functional particle 112, it is preferable to maintain a diameter of the extension part 111a of the fiber 111 as approximately 10 μm.

Meanwhile, it is preferable that the functional particle 112 is included in the adhesive having a weight ranging from approximately 1 wt % to approximately 50 wt %.

That is, in the case where the binding resin 210 is added to the adhesive 300, it is more preferable that content of the functional particle 112 is adjusted to be approximately 1 wt % to approximately 50 wt % out of whole content in the adhesive 300 including the binding resin 210.

For stably performing both of combination (adherence) between two electronic components physically separated from each other and function exhibition of a selective functional particle, a weight of the functional particle 112 is limited as described above. For instance, in the case where content of the functional particle 112 is larger than the above-described range, an electrical short may occur during bonding electronic components and manufacturing cost is increased due to unnecessarily excessive use of functional particles. Also, in the case where content of the functional particle 112 is smaller than the above-described range, an electrical open may occur during bonding electronic components because characteristics of electrical conductivity cannot be sufficiently exhibited.

Although preferable conditions of a diameter of the functional particle, and a thickness of the coating part and a length of the extension part of the carrier polymer are suggested exemplifying a particle having electrical conductivity as the functional particle included in the fiber in the above-described embodiment, a diameter of the functional particle, and a thickness of the coating part and a length of the extension part of the carrier polymer may be variously changed when another particle having other characteristics is used for the functional particle.

Next, structures and functions of electronic components bonded using an adhesive are described with reference to drawings.

FIGS. 14A to 14E are diagrams sequentially illustrating a method for connecting electronic components using an adhesive according to an exemplary embodiment of the present disclosure.

A particle having electrical conductivity is used for the functional particle 112 included in the fiber 110 of the adhesive 300, nonconductive polymer is used for the carrier polymer 111, and thermosetting resin is used for the binding resin 210.

Figure 14A:
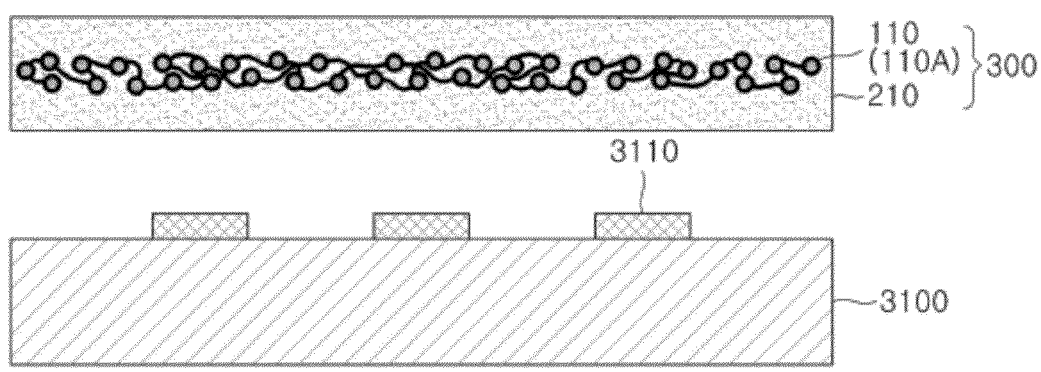
FIGS. 14A to 14E are diagrams sequentially illustrating a method for connecting electronic components using an adhesive according to an exemplary embodiment of the present disclosure.

Referring to FIG. 14A, a first bond object, e.g., a first electronic component 3100, is prepared. Herein, a plurality of first connection parts 3110 separated from each other is formed on an upper surface of the first electronic component 3100. And, the adhesive 300 according to the exemplary embodiment is arranged over the first electronic component 3100 where the first connection parts 3110 are formed. The adhesive 300 includes the binding resin 210 and the fiber 110, and has a film form having a certain thickness.

Figure 14B:
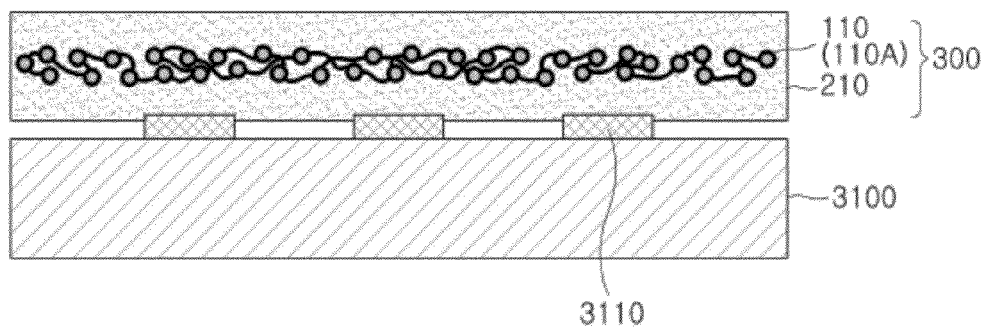

And, as illustrated in FIG. 14B, the adhesive 300 is bonded to an upper portion of the first connection part 3110. Herein, the bonding part 210b of the binding resin 210 included in the adhesive 300, where the fiber 110 dose not subside, is bonded to an upper portion of the first connection part 3110.

Figure 14C:
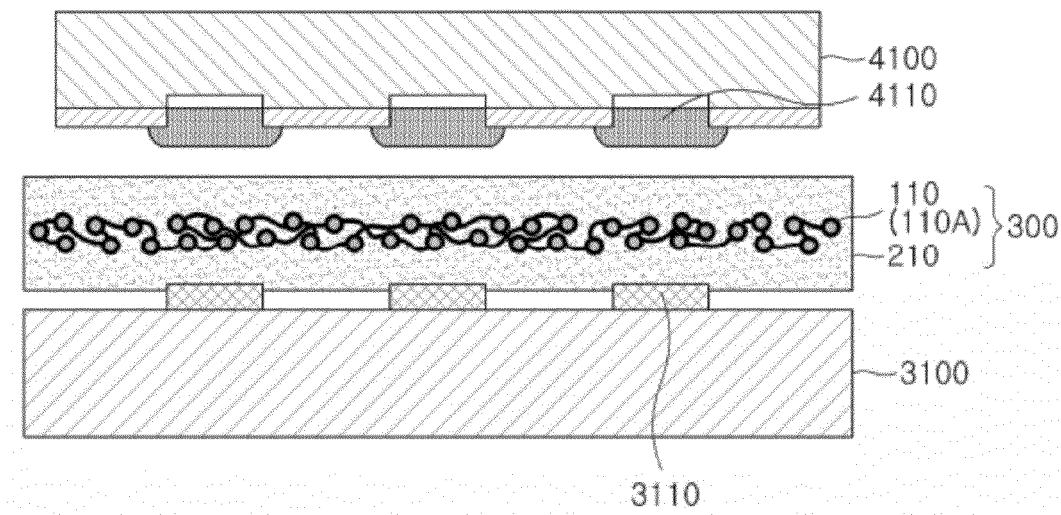

Thereafter, a second electronic component 4100 at one side of which a plurality of second connection parts 4110 are formed is prepared. Herein, the number of the second connection parts 4110 corresponds to that of the first connection parts 3110, and it is preferable to manufacture the second connection parts 4110 with conductive materials. And, as illustrated in FIG. 14C, the first connection part 3110 of the first electronic component 3100 is disposed to face the second connection part 4110 of the second electronic component 4100. Herein, it is preferable that the second connection part 4110 is positioned right over the first connection part 3110.

Figure 14D:
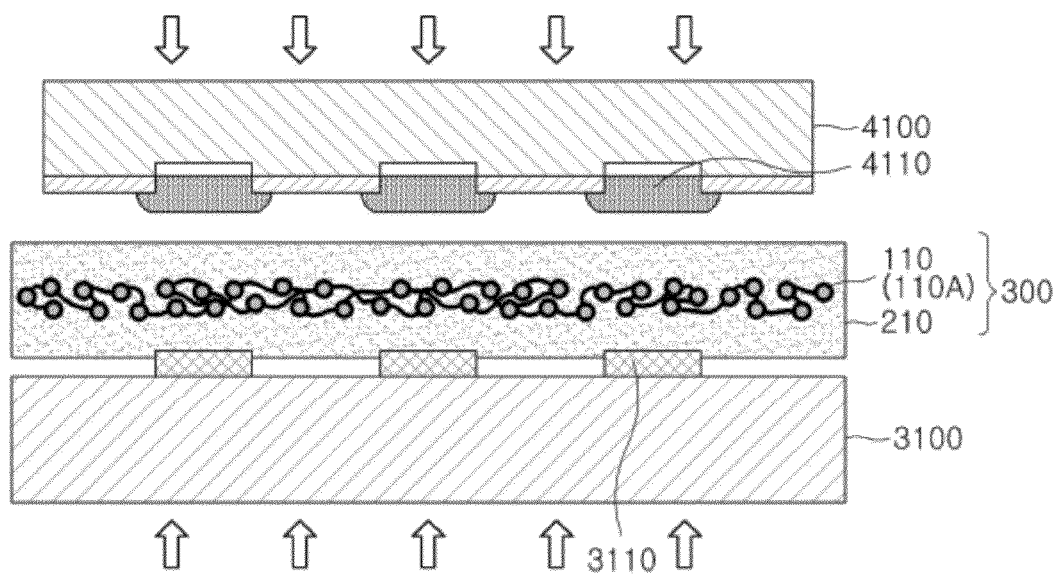

Thereafter, as illustrated in FIG. 14D, pressure is applied to the first electronic component 3100 from bottom to top, and to the second electronic component from top to bottom while applying heat to the first and second connection parts 3110 and 4110 and the adhesive 300. Herein, heating and pressuring time is preferably several seconds to several tens of seconds, heating temperature is preferably approximately 120° C. to approximately 200° C., and compressing pressure is preferably approximately 40 Mpa to approximately 80 Mpa.

Figure 14E:
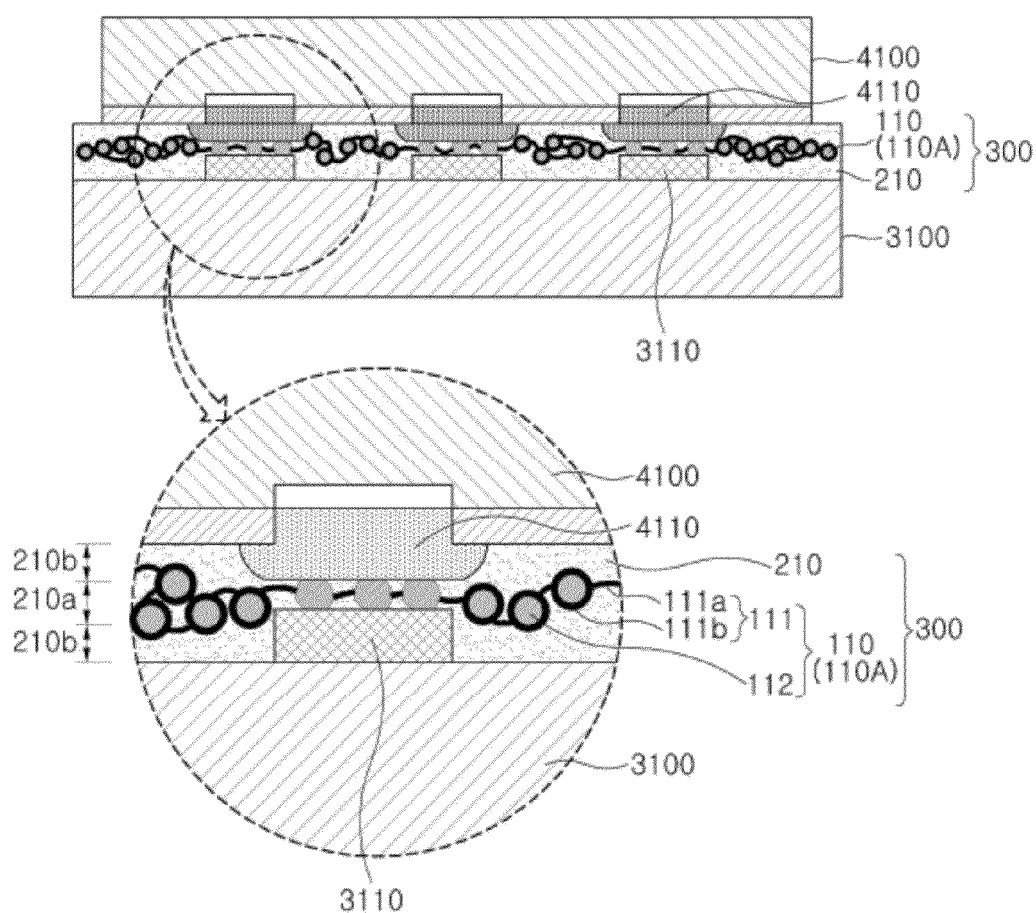

Through the thermocompression bonding process, as illustrated in FIG. 14E, the first connection part 3110 of the first electronic component 3100 and the second connection part 4110 of the second electronic component 4100 subside into the adhesive 300. A region of an upper portion of the first electronic component 3100 where the first connection part 3110 is not formed and a region of an upper portion of the second electronic component 4100 where the second connection part 4110 is not formed are bonded to the adhesive 300, preferably to, a region of the bonding part 210b on and under the binding resin 210.

Accordingly, compressing pressure applied through the first and second electronic components 3100 and 4100 is delivered to the adhesive 300. Herein, due to the compressing pressure delivered to the adhesive 300, fluidness (or flow) of the binding resin 210 occurs. Preferably, the binding resin 210 flows from a region between the first connection part 3110 and the second connection part 4110 to other regions except for the region between the first connection part 3110 and the second connection part 4110. However, the fiber 110 tangled in a net structure is prevented from being moved in spite of the fluidness of the binding resin 210, and thus the functional particle 112 is also prevented from being moved.

Also, a separation distance between the first connection part 3110 and the second connection part 4110 is shorter than a separation distance between an upper surface of the first electronic component 3100 where the first connection part 3110 is not formed and a lower surface of the second electronic component 4100 where the second connection part 4110 is not formed. Therefore, a region of the subsidence part 210a positioned between the first connection part 3110 and the second connection part 4110 out of a whole region of the adhesive 300 receives higher compressing pressure in comparison with the other regions. Therefore, as illustrated in a magnified diagram of FIG. 14E, due to the pressure delivered to the adhesive 300, the carrier polymer 111 embedding the functional particle 112 positioned between the first connection part 3110 and the second connection part 4110, i.e., the coating part 111b, is physically broken, and thus the corresponding functional particle 112 is exposed.

Due to the physical brokenness of the coating part 111b, the first connection part 3110 is connected to the second connection part 4110 by the functional particle 112 so that an electric connection is achieved. And, the coating part 111b positioned between regions where the first and second connection regions 3110 and 4110 are not formed is not broken. Therefore, positions where an electric connection is not desired, i.e., a region of the first electronic component 3100 where the first connection part 3110 is not formed and a region of the second electronic component 4100 where the second connection part 4110 is not formed, may be prevented from being electrically connected to each other. That is, an electrical short may be prevented.

As described above, the pair of electronic components 3100 and 4100 may be easily bonded to each other using the adhesive 300 including the fiber 110 according to the present disclosure. That is, by suppressing movement of the functional particle 112 during the thermocompression bonding process using the fiber 110 in which the functional particle 112 is fixed, an open and a short between the pair of electronic components 3100 and 4100 may be prevented. Further, an electrical connection between the first connection part 3110 and the second connection part 4110 may be easily achieved using functional particles of same diameters even though sizes of the first and second connection parts 3110 and 4110 are decreased. Furthermore, since the functional particle 112 of the fiber 110 is physically fixed to the carrier polymer 111 and the fiber 110 itself is regularly or irregularly tangled, it is strong against an external physical impact.

Although it is described above that plural connection parts are bonded to each other, the adhesive of the present disclosure may be used for various forms of bonding. For instance, the adhesive may be used for bonding a single electronic component and a substrate, and for bonding electronic components each of which has a single connection part. Also, a fiber including functional particles and a film including the fiber may be used for various uses besides a bond of electronic components.

According to the exemplary embodiments of the present disclosure, functional particles having various electromagnetic or optical functions are embedded in carrier polymer to be physically fixed, and thus a functional fiber having various functions and high stability can be manufactured.

Further, since the functional particle is stably fixed in the carrier polymer and stably and sufficiently exhibits its functions, a high-functional fiber exhibiting high functions with small amount of functional particles can be manufactured.

Also, a method for manufacturing the functional fiber is easy, and mass production is possible at low cost.

The adhesive according to the exemplary embodiments of the present disclosure includes the fiber where the functional particle is fixed by the carrier polymer, and is realized in a fiber aggregate form where fibers are regularly or irregularly arranged in a net form. Therefore, fluidness of the functional particle can be suppressed during a following process or during use of an adhesive. For instance, by using the adhesive according to the exemplary embodiments of the present disclosure for bonding electronic components, excessive movement of the functional particle due to flow of the binding resin can be suppressed even during thermocompression bonding process, and thus a short or an open occurring at a bonding part of an electronic component can be prevented.

Further, since a large amount of functional particles are not needed for preventing the open phenomenon in comparison with the related art, the adhesive having excellent adhesive performance can be manufactured with relatively small amount of functional particles.

Furthermore, in those instances where a convention analogous to "at least one of A, B, and C, etc." is used, in general such a construction is intended in the sense one having skill in the art would understand the convention (for example, "a compound having at least one of A, B, and C" would include but not be to compounds that have A alone, B alone, C alone, A and B together, A and C together, B and C together, and/or A, B, and C together, etc.).

Although the fiber, the fiber aggregate, and the adhesive having the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A method of manufacturing a fiber, the method comprising:
    preparing a solution comprising a plurality of functional particles and a carrier polymer; and
    drawing a fiber by spinning the solution such that the plurality of functional particles are embedded in the carrier polymer, the fiber including a plurality of coating parts and at least one extension part, wherein each of the plurality of coating parts coats respective ones of the plurality of functional particles, wherein the at least one extension part physically connects adjacent ones of the plurality of coating parts and suppresses free movement of the adjacent coating parts with respect to each other to prevent functional interaction between the plurality of functional particles arranged in the adjacent coating parts, and wherein a thickness of the coating part is approximately 0.1% to approximately 50% of a radius of the respective one of the plurality of functional particles.

2. The method of claim 1, wherein the solution is prepared by dispersing the plurality of functional particles in the carrier polymer.

3. The method of claim 1, wherein, drawing of the fiber by spinning the solution comprises electrospinning by forming an electric field at a region to which the solution is spun during spinning of the solution.

4. The method of claim 1, wherein the plurality of functional particles comprise at least one of an electrically conductive particle, a far-infrared radiation particle, a fluorescent particle, a phosphorescent particle, and a magnetic particle.

5. The method of claim 4, wherein the electrically conductive particle comprises at least one of Ni, Ag, Cu, Au, Sn—Pb base, Sn—Ag base, Sn—Ag—Cu base, Sn—Bi base, Sn—Zn—Bi base, Sn—In base, Sn—Zn—Al base and Sn—Bi—Ag base, a compound thereof, or a particle where an electric conductive film is coated on an outer surface of a polymer core.

6. The method of claim 1, wherein the carrier polymer comprises at least one of, or a compound of: polyolefine, polystyrene, polyvinylalcohol, polyacrylonitrile, polyamide, polyester, aramide, acrylic, polyethylene oxide (PEO), polycaprolactone, polycarbonate, polyethylene terephthalate, polybezimidazole (PBI), poly(2-hydroxyethylmethacrylate), polyvinylidene fluoride, poly(ether imide), styrene-butadiene-styrene triblock copolymer (SBS), poly(ferrocenyldimethylsilane), polyphenylenesulfide, and polyetheretherketone.

7. The method of claim 1, wherein, in the drawing of the fiber by spinning the solution, a plurality of strands of the fiber are regularly arranged or irregularly arranged to form a net structure.

8. A method comprising:
    preparing a solution comprising a functional particle and a carrier polymer;
    drawing a fiber by spinning the solution such that the plurality of functional particles are embedded in the carrier polymer, the fiber including a plurality of coating parts and at least one extension part, wherein each of the plurality of coating parts coats respective ones of the plurality of functional particles, wherein the at least one extension part physically connects adjacent ones of the plurality of coating parts and suppresses free movement of the adjacent coating parts with respect to each other to prevent functional interaction between the plurality of functional particles arranged in the adjacent coating parts; and
    forming an adhesive by allowing the fiber to subside into a binding resin such that the fiber having the plurality of coating parts and the at least one extension part is disposed at an approximately middle region of the binding resin along a length direction.

9. The method of claim 8, wherein drawing of the fiber by spinning the solution comprises electrospinning by forming an electric field at a region to which the solution is spun during spinning the solution.

10. The method of claim 8, wherein the forming of the adhesive comprises:
    preparing an adhesive film;
    arranging the fiber on the adhesive film; and
    allowing the fiber to subside into the adhesive film.

11. The method of claim 10, wherein the preparing of the adhesive film comprises:
    preparing a release film; and
    forming a binding resin layer by applying a binding resin solution on one side of the release film.

12. The method of claim 10, wherein the allowing of the fiber to subside into the adhesive film comprises applying heat and compressing pressure.

13. The method of claim 11, wherein the allowing of the fiber to subside into the adhesive film comprises allowing the fiber to subside into the binding resin layer of the adhesive film.

14. The method of claim 8, wherein an electrically conductive particle is used for the functional particle.

15. The method of claim 14, wherein the electrically conductive particle comprises at least one of Ni, Ag, Cu, Au, Sn—Pb base, Sn—Ag base, Sn—Ag—Cu base, Sn—Bi base, Sn—Zn—Bi base, Sn—In base, Sn—Zn—Al base and Sn—Bi—Ag base, a compound of them, or a particle where an electric conductive film is coated on an outer surface of a polymer core.

16. The method of claim 8, wherein the carrier polymer comprises at least one or a compound of polyolefine, polystyrene, polyvinylalcohol, polyacrylonitrile, polyamide, polyester, aramide, acrylic, polythylene oxide (PEO), polycaprolactone, polycarbonate, polyethylene terephthalate, polybezimidazole (PBI), poly(2-hydroxyethylmethacrylate), polyvinylidene fluoride, poly(ether imide), styrene-butadiene-styrene triblock copolymer (SBS), poly(ferrocenyldimethylsilane), polyphenylenesulfide, and polyetheretherketone.

17. The method of claim 8, further comprising applying a compressing pressure and a heating temperature to the adhesive to expose a portion of at least one of the plurality of functional particles.

18. The method of claim 17, wherein the at least one of the plurality of functional particles is exposed by breaking at least one of the coating parts using pressure and heat.

19. The method of claim 17, wherein the heating temperature is approximately 120° C. to approximately 200° C., and the compressing pressure is approximately 40 Mpa to approximately 80 Mpa.

\* \* \* \* \*